(12) United States Patent
Jung

(10) Patent No.: US 10,978,161 B2
(45) Date of Patent: Apr. 13, 2021

(54) MEMORY SYSTEM, MEMORY CONTROLLER AND MEMORY DEVICE

(71) Applicant: SK hynix Inc., Gyeonggi-do (KR)

(72) Inventor: Young Il Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/696,585

(22) Filed: Nov. 26, 2019

(65) Prior Publication Data

US 2020/0381061 A1 Dec. 3, 2020

(30) Foreign Application Priority Data

Jun. 3, 2019 (KR) .................. 10-2019-0065198

(51) Int. Cl.
*G11C 16/22* (2006.01)
*G11C 16/14* (2006.01)
*G11C 16/24* (2006.01)
*G11C 16/12* (2006.01)
*G11C 16/08* (2006.01)

(52) U.S. Cl.
CPC ............ *G11C 16/225* (2013.01); *G11C 16/08* (2013.01); *G11C 16/12* (2013.01); *G11C 16/14* (2013.01); *G11C 16/24* (2013.01)

(58) Field of Classification Search
CPC ....... G11C 16/225; G11C 16/24; G11C 16/08; G11C 16/14; G11C 16/12
See application file for complete search history.

(56) References Cited

U.S. PATENT DOCUMENTS

| 9,330,773 B2* | 5/2016 | Lim | G11C 16/20 |
| 9,607,711 B1* | 3/2017 | Lee | G11C 16/0483 |
| 2012/0268996 A1* | 10/2012 | Park | G11C 7/18 |
| | | | 365/185.12 |
| 2015/0287466 A1* | 10/2015 | Kim | G11C 16/0483 |
| | | | 711/103 |

FOREIGN PATENT DOCUMENTS

| KR | 10-2009-0055314 | 6/2009 |
| KR | 10-2011-0132072 | 12/2011 |
| KR | 10-2020-0076403 A | 6/2020 |

* cited by examiner

*Primary Examiner* — Ajay Ojha
(74) *Attorney, Agent, or Firm* — IP & T Group LLP

(57) ABSTRACT

A memory system, a memory controller and a memory device. In a set operation, by applying different pass voltages to at least one first word line and at least one second word line among the plurality of word lines excluding a selected target word line, an operation error of the memory device may be prevented.

17 Claims, 18 Drawing Sheets

FIG. 7
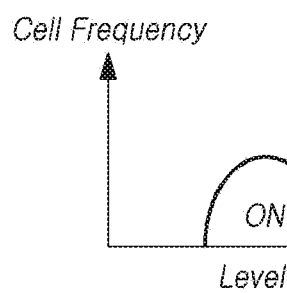
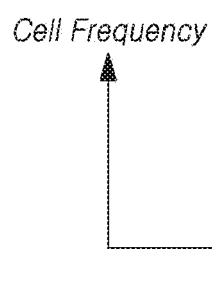

MEMORY SYSTEM, MEMORY CONTROLLER AND MEMORY DEVICE

CROSS-REFERENCE TO RELATED APPLICATION

The present application claims priority under 35 U.S.C. 119(a) to Korean Patent Application No. 10-2019-0065198, filed on Jun. 3, 2019, which is incorporated herein by reference in its entirety.

BACKGROUND

1. Technical Field

Various embodiments generally relate to a memory system, a memory controller and a memory device.

2. Related Art

A memory system stores data based on a request of a host, such as a computer, a mobile terminal such as a smartphone and a tablet, or any of various other electronic devices. The memory system may be of a type that stores data in a magnetic disk, such as a hard disk drive (HDD), or of a type that stores data in a nonvolatile memory, such as a solid state drive (SDD), a universal flash storage (UFS) device and an embedded MMC (eMMC) device.

The nonvolatile memory included in the memory system may include any of a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM).

The memory system may further include a memory controller for controlling a memory device. The memory controller may receive a command from the host, and may perform or control an operation for reading, writing or erasing data with respect to a memory in the memory system, based on the received command.

Main operations of the memory device may include read, program and erase operations. An operation error may occur for various reasons during such operations of the memory device.

SUMMARY

Various embodiments are directed to a memory system, a memory controller and a memory device capable of preventing an operation error during a data-related operation of the memory device.

Also, various embodiments are directed to a memory system, a memory controller and a memory device enabling a normal operation even when a change occurs in threshold voltages of memory cells in the memory device and distributions thereof.

Further, various embodiments are directed to a memory system, a memory controller and a memory device capable of differentially supplying a pass voltage to be supplied in a corresponding operation, depending on a state (a program state or an erase state) of memory cells in the memory device.

In one aspect, embodiments of the disclosure may provide a memory system including: a memory device having a plurality of word lines and a plurality of bit lines disposed therein, and configured to apply, in a set operation, different pass voltages to at least one first word line and at least one second word line among the plurality of word lines excluding a selected target word line; and a memory controller configured to control an operation of the memory device.

The memory device may apply a first pass voltage to the at least one first word line, and may apply a second pass voltage lower than the first pass voltage to the at least one second word line.

The memory device may apply the different pass voltages to the at least one first word line and the at least one second word line depending on whether each of a page corresponding to the at least one first word line and a page corresponding to the at least one second word line stores data.

The at least one first word line may correspond to a page which includes at least one programmed memory cell, and the at least one second word line may correspond to a page which includes at least one erased memory cell.

The set operation may be a read operation. As the case may be, the set operation may be a program operation.

The memory controller may transmit pass voltage control information to the memory device, and the memory device may receive the pass voltage control information and based thereon may apply the different pass voltages to the at least one first word line and the at least one second word line.

For instance, the memory controller may transmit the pass voltage control information including most recent program location information indicating a last programmed page before performing the set operation of the memory device or a most recent program word line corresponding to the most recently programmed page, to the memory device.

The memory device may apply the different pass voltages to the at least one first word line and the at least one second word line, based on the most recent program location information.

For another instance, the memory controller may transmit the pass voltage control information including boundary erase location information indicating an erased page adjacent to a most recently programmed page before performing the set operation of the memory device or an erase word line corresponding to the erased page, to the memory device.

The memory device may apply the different pass voltages to the at least one first word line and the at least one second word line, based on the boundary erase location information.

In another aspect, embodiments of the disclosure may provide a memory controller including: a memory interface configured to communicate with a memory device which has a plurality of word lines and a plurality of bit lines disposed therein; and a control circuit configured to control different pass voltages to be applied to at least one first word line and at least one second word line among the plurality of word lines excluding a selected target word line, in a set operation of the memory device.

The control circuit may control the different pass voltages to be applied to the at least one first word line and the at least one second word line depending on whether each of a page corresponding to the at least one first word line and a page corresponding to the at least one second word line stores data.

The control circuit may control a first pass voltage to be applied to the at least one first word line, and may control a second pass voltage lower than the first pass voltage to be applied to the at least one second word line.

The at least one first word line may correspond to a page which includes at least one programmed memory cell, and the at least one second word line may correspond to a page which includes at least one erased memory cell.

The control circuit may transmit pass voltage control information to the memory device through the memory interface.

For example, the control circuit may transmit the pass voltage control information including most recent program location information or boundary erase location information before performing the predetermined operation of the memory device, to the memory device through the memory interface.

Depending on the most recent program location information or the boundary erase location information, the first pass voltage applied to the at least one first word line and the second pass voltage applied to the at least one second word line may become different.

Depending on the most recent program location information or the boundary erase location information, the first pass voltage may be applied to the at least one first word line, and the second pass voltage different from the first pass voltage may be applied to the at least one second word line.

The control circuit of the memory controller may transmit the pass voltage control information including the most recent program location information or the boundary erase location information in the memory device in each predetermined operation of the memory device.

For another example, the control circuit of the memory controller may not transmit the pass voltage control information in each predetermined operation of the memory device, and, only in the case where the most recent program location information or the boundary erase location information in the memory device is changed, may transmit the pass voltage control information including changed most recent program location information or changed boundary erase location information.

In still another aspect, embodiments of the disclosure may provide a memory device including: a memory cell array having a plurality of word lines and a plurality of bit lines disposed therein; and a voltage output circuit configured to output different pass voltages to at least one first word line and at least one second word line among the plurality of word lines excluding a target word line for a set operation.

The voltage output circuit may output the different pass voltages to the at least one first word line and the at least one second word line depending on whether each of a page corresponding to the at least one first word line and a page corresponding to the at least one second word line stores data.

The voltage output circuit may output a first pass voltage to the at least one first word line, and may output a second pass voltage lower than the first pass voltage to the at least one second word line.

The at least one first word line may correspond to a program word line corresponding to a programmed memory cell, and the at least one second word line may correspond to an erase word line corresponding to an erased memory cell.

The memory device may further include a control logic configured to receive last program location information or first erase location information before performing the predetermined operation, from a memory controller.

The voltage output circuit may output a first pass voltage to the at least one first word line and may output a second pass voltage different from the first pass voltage to the at least one second word line, depending on pass voltage control information including the last program location information or the first erase location information.

In still another aspect, embodiments of the disclosure may provide a memory system including a memory device which includes plural pages, and configured to perform a target operation to a target page among the pages.

The memory system may include a memory controller configured to classify the plural pages into a programmed page group and an erased page group and configured to control the memory device to apply to the programmed and erased page groups, excluding for the target page, respectively first and second pass voltages during the target operation.

The memory device may independently set the first and second pass voltages based on threshold voltage statuses of the programmed and erased page groups.

According to the embodiments of the disclosure, it is possible to provide a memory system, a memory controller and a memory device capable of preventing an operation error during a data-related operation of the memory device.

Also, according to the embodiments of the disclosure, it is possible to provide a memory system, a memory controller and a memory device enabling a normal operation even when a change occurs in threshold voltages of memory cells in the memory device and distributions thereof.

Further, according to the embodiments of the disclosure, it is possible to provide a memory system, a memory controller and a memory device capable of differentially supplying a pass voltage to be supplied in a corresponding operation, depending on a state (a program state or an erase state) of memory cells in the memory device.

BRIEF DESCRIPTION OF THE DRAWINGS

FIG. 7 is a diagram to assist in the explanation of pass voltage control in a memory system in accordance with an embodiment of the disclosure.

DETAILED DESCRIPTION

Figure 1:
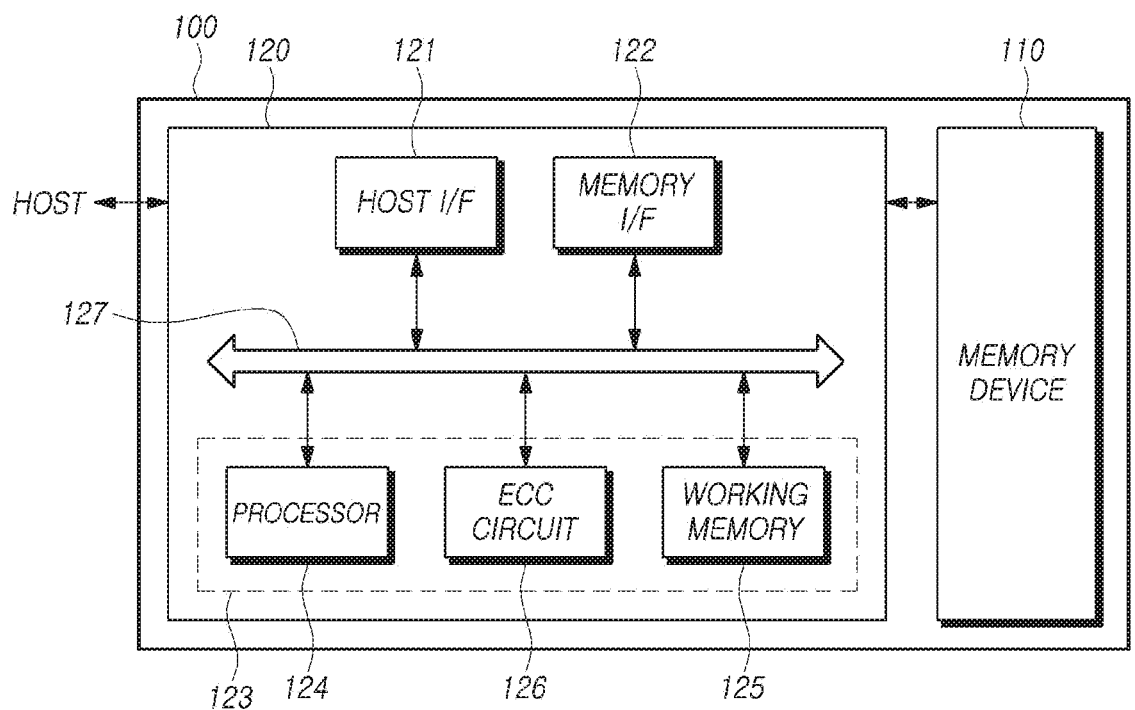
FIG. 1 is a diagram schematically illustrating a configuration of a memory system in accordance with an embodiment of the disclosure.

Various embodiments of the disclosure are described in detail below with reference to the accompanying drawings. In the following description, the same elements are designated by the same reference numerals throughout the drawings. Further, well-known technical information may be omitted so as not to obscure features and aspects of the present invention. Also, open-ended terms, such as "comprising," "having," "including" and the, used in the description and claims, should not be interpreted as being restricted to the elements or operations listed thereafter unless specifically stated otherwise. Where an indefinite or definite article is used when referring to a singular noun, e.g. "a," "an," "the," this may include a plural of that noun unless specifically stated otherwise.

Also, in describing components of the disclosure, terms such as first, second, A, B, (a), and (b) may be used. These are solely for the purpose of differentiating one component from the other but not to imply or suggest the substances, order, sequence or number of the components.

With regard to positional relationships of components, in the case where it is described that at least two components are "connected," "coupled" or "linked," it is to be understood that the at least two components may be directly "connected," "coupled" or "linked" or may be indirectly "connected," "coupled" or "linked" with another component interposed between the two components. Here, another component may be included in at least one of the at least two components which are "connected," "coupled" or "linked" with each other.

In describing time flow relationships of components, an operating method or a fabricating method, in the case where pre and post relationships in terms of time or flow are described, for example, by "after," "following," "next" or "before," non-continuous cases may be included unless "immediately" or "directly" is used.

In the case where a numerical value for a component or its corresponding information (e.g., level, etc.) is mentioned, even though there is no separate explicit description, the numerical value or its corresponding information can be interpreted as including an error range that may be caused by various factors (for example, a process variable, an internal or external shock, noise, etc.).

A memory system, a memory controller and a memory device are described below in detail with reference to the accompanying drawings through various embodiments of the disclosure. Throughout the specification, reference to "an embodiment" or the like is not necessarily to only one embodiment, and different references to any such phrase are not necessarily to the same embodiment(s).

FIG. 1 is a configuration diagram schematically illustrating a representation of an example of a memory system 100 in accordance with an embodiment of the disclosure.

Referring to FIG. 1, the memory system 100 may include a memory device 110 which stores data, and a memory controller 120 which controls the memory device 110.

The memory device 110 includes a plurality of memory blocks, and operates in response to the control of the memory controller 120. Operations of the memory device 110 may include, for example, a read operation, a program operation (also referred to as a write operation) and an erase operation.

The memory device 110 may include a memory cell array including a plurality of memory cells (also simply referred to as "cells") which store data. Such a memory cell array may exist in a memory block.

For example, the memory device 110 may be realized as any of various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (STT-RAM).

The memory device 110 may be realized in a three-dimensional array structure. Embodiments of the disclosure may be applied to not only a flash memory device in which a charge storage layer is configured by a conductive floating gate but also a charge trap flash (CTF) in which a charge storage layer is configured by a dielectric layer.

The memory device 110 is configured to receive a command, an address and the like from the memory controller 120 and access a region in the memory cell array which is selected by the address. In other words, the memory device 110 may perform an operation corresponding to the command, for a region selected by the address.

For example, the memory device 110 may perform a program operation, a read operation and an erase operation. In this connection, in the program operation, the memory device 110 may program data in a region selected by the address. In the read operation, the memory device 110 may read data from a region selected by the address. In the erase operation, the memory device 110 may erase data stored in a region selected by the address.

The memory controller 120 may control write (program), read, erase and background operations for the memory device 110. For example, the background operation may include at least one among a garbage collection (GC) operation, a wear leveling (WL) operation, a bad block management (BBM) operation, and the like.

The memory controller 120 may control the operation of the memory device 110 according to a request of a host. The memory controller 120 may also control the operation of the memory device 110 regardless of a request of the host.

The memory controller 120 and the host may be separate devices. Alternatively, the memory controller 120 and the host may be integrated into one device. In the following description, as an example, the memory controller 120 and the host are separate devices.

Referring to FIG. 1, the memory controller 120 may include a memory interface 122, a control circuit 123, a host interface 121, as well as other components.

The host interface 121 provides an interface for communication with the host.

When receiving a command from the host, the control circuit 123 may receive the command through the host interface 121, and then, may perform an operation of processing the received command.

The memory interface 122 is coupled with the memory device 110 and thereby provides an interface for communication with the memory device 110. That is to say, the memory interface 122 may be configured to provide the interface between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125, and as the case may be, may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA) provided by the host into a physical block address (PBA), through the flash translation layer (FTL). The flash translation layer (FTL) may receive the logical block address (LBA) and translate the received logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 is configured to randomize data received from the host. For example, the processor 124 may randomize data received from the host, by using a randomizing seed. Randomized data as data to be stored is provided to the memory device 110 and is programmed to the memory cell array.

The processor 124 is configured to derandomize data received from the memory device 110 in a read operation. For example, the processor 124 may derandomize data received from the memory device 110, by using a derandomizing seed. Derandomized data may be outputted to the host.

The processor 124 may control the operation of the memory controller 120 by executing firmware. In other words, in order to control general operations of the memory controller 120 and perform a logic calculation, the processor 124 may execute (drive) firmware loaded to the working memory 125 upon booting.

The firmware as a program to be executed in the memory system 100 may include various functional layers.

For example, the firmware may include at least one among a flash translation layer (FTL) which performs a translating function between a logical address requested to the memory system 100 from the host and a physical address of the memory device 110, a host interface layer (HIL) which serves to analyze a command requested to the memory system 100 as a storage device from the host and transfers the command to the flash translation layer (FTL), and a flash interface layer (FIL) which transfers a command instructed from the flash translation layer (FTL) to the memory device 110.

For instance, such firmware may be stored in the memory device 110 and then be loaded to the working memory 125.

The working memory 125 may store firmware, program code, a command and data to drive the memory controller 120. The working memory 125, for example, as a volatile memory, may include at least one among an SRAM (static RAM), a DRAM (dynamic RAM) and an SDRAM (synchronous DRAM).

The error detection and correction circuit 126 may be configured to detect error(s) in data and correct the detected error(s), by using an error correction code. Here, the data may be stored in the working memory 125, data read from the memory device 110, or the like.

The error detection and correction circuit 126 may be realized to decode data by using an error correction code. The error detection and correction circuit 126 may be realized by any of various code decoders. For example, a decoder which performs unsystematic code decoding or a decoder which performs systematic code decoding may be used.

For example, the error detection and correction circuit 126 may detect error bit(s) for each read data, in the unit of sector. Namely, each read data may be constituted by a plurality of sectors. A sector may mean a data unit smaller than a page as a read unit of a flash memory. Sectors constituting each read data may be matched with one another by the medium of an address.

The error detection and correction circuit 126 may calculate a bit error rate (BER), and may determine whether an error is correctable or not, in the unit of sector. For example, in the case where a bit error rate (BER) is higher than a reference value, the error detection and correction circuit 126 may determine a corresponding sector as being uncorrectable or a fail. On the other hand, in the case where a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to be the last. There may be one or more sectors that are determined to be uncorrectable. The error detection and correction circuit 126 may transfer information (for example, an address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the like, and a data bus for transferring various data.

The above-described components 121, 122, 124, 125 and 126 of the memory controller 120 represent an exemplary configuration. In some cases, one or more of these components 121, 122, 124, 125 and 126 of the memory controller 120 may be omitted, or may be integrated into a single component. As the case may be, in addition to the above-described components 121, 122, 124, 125 and 126 of the memory controller 120, at least one other component may be added.

The memory device 110 is described in further detail with reference to FIG. 2.

Figure 2:
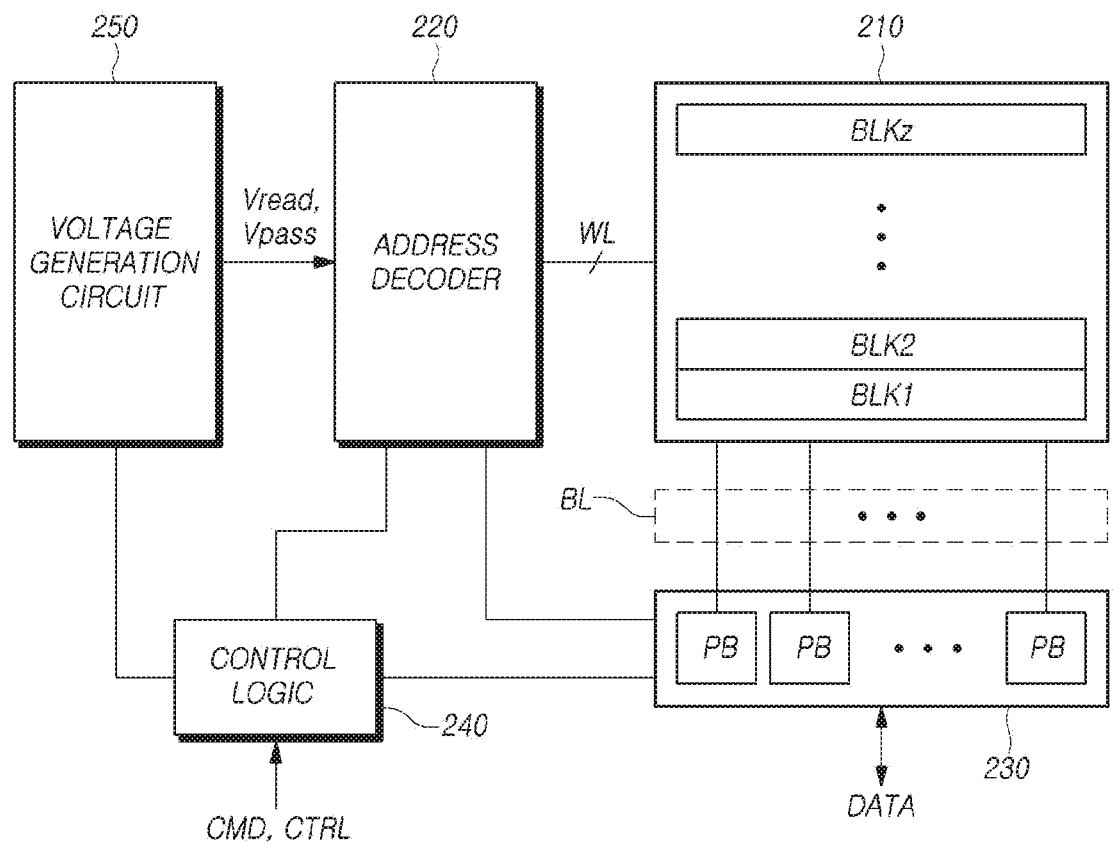
FIG. 2 is a diagram schematically illustrating a memory device in accordance with an embodiment of the disclosure.

FIG. 2 is a block diagram schematically illustrating a representation of an example of the memory device 110 in accordance with an embodiment of the disclosure.

Referring to FIG. 2, the memory device 110 may include a memory cell array 210, an address decoder 220, a read and write circuit 230, control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed in an intersecting arrangement, and a plurality of memory cells (MC) may be arranged at the respective intersections.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures.

The memory cell array 210 may be configured as a two-dimensional structure, or as a three-dimensional structure.

Each of the plurality of memory cells included in the memory cell array 210 may store at least 1-bit data. For instance, each such memory cell may be a single level cell (SLC) storing 1-bit data, a multi-level cell (MLC) which stores 2-bit data, a triple level cell (TLC) which stores 3-bit data, or a quad level cell (QLC) which stores 4-bit data. For still yet another instance, the memory cell array 210 may include a plurality of memory cells, each of which stores 5 or more-bit data.

Referring to FIG. 2, the address decoder 220, the read and writhe circuit 230, the control logic 240 and the voltage generation circuit 250 may collectively operate as a peripheral circuit which drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory device 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which take charge of a data processing function, and as the case may be, may further include cache buffers which take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. In an embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Figure 3:
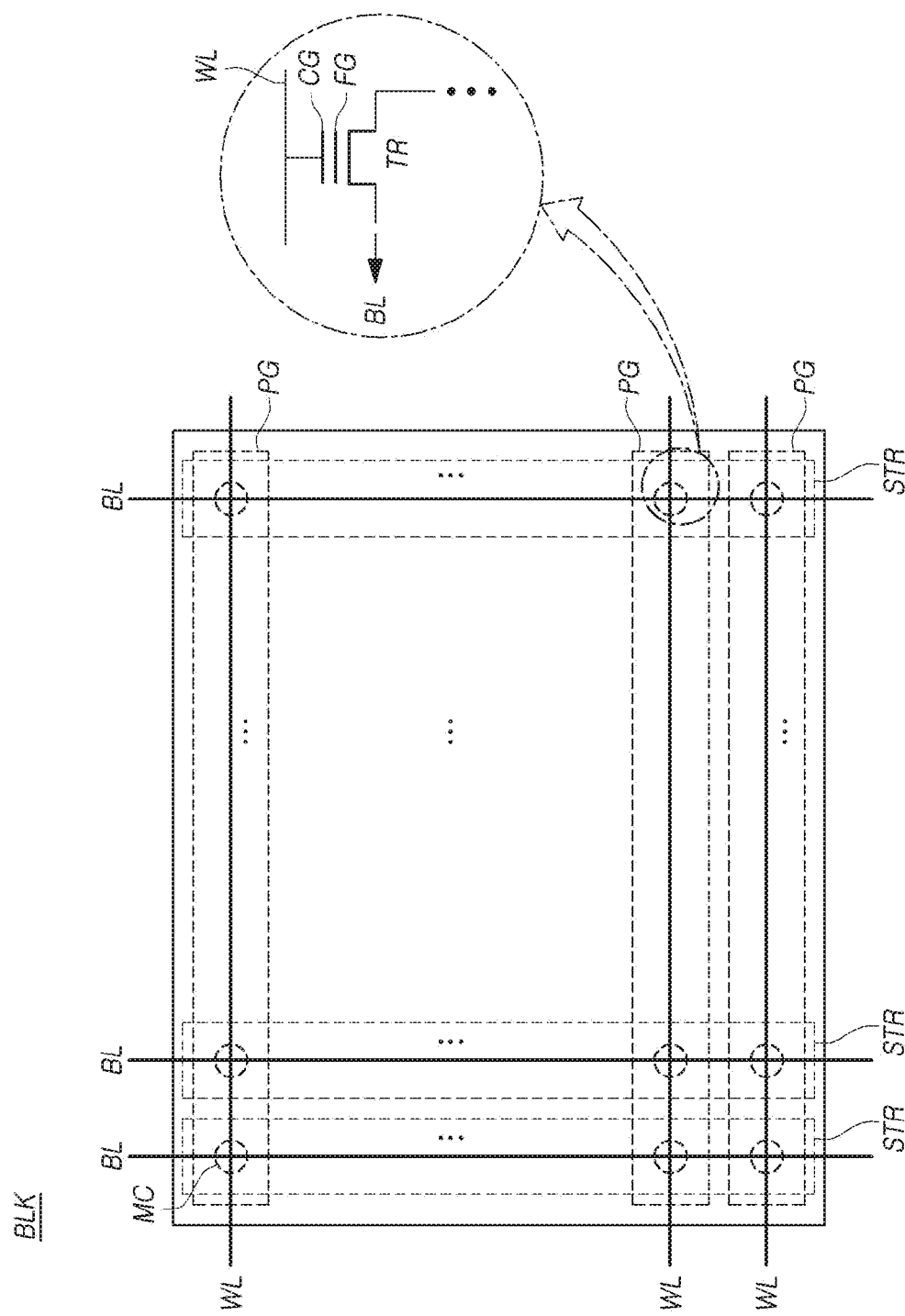
FIG. 3 is a diagram schematically illustrating a structure of a memory block of a memory device in accordance with an embodiment of the disclosure.

FIG. 3 is a diagram schematically illustrating a representative memory block BLK of the memory device 110 in accordance with an embodiment of the disclosure.

Referring to FIG. 3, the memory block BLK may be configured, for example, as a plurality of pages PG and a plurality of strings STR are disposed in directions intersecting with each other.

The plurality of pages PG correspond to a plurality of word lines WL, and the plurality of strings STR correspond to a plurality of bit lines BL.

In the memory block BLK, the plurality of word lines WL and the plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

As the plurality of word lines WL and the plurality of bit lines BL intersect with each other, a plurality of memory cells MC may be defined. A transistor TR may be disposed in each memory cell MC.

For example, the transistor TR disposed in each memory cell MC may include a drain, a source and a gate. The drain (or source) of the transistor TR may be coupled with a corresponding bit line BL directly or via another transistor TR. The source (or drain) of the transistor TR may be coupled with a source line (which may be the ground) directly or via another transistor TR. The gate of the transistor TR may include a floating gate FG which is surrounded by a dielectric and a control gate CG to which a gate voltage is applied from a word line WL.

In each of the plurality of memory blocks BLK1 to BLKz, a first select line (also referred to as a source select line or a drain select line) may be additionally disposed outside a first outermost word line more adjacent to the read and write circuit 230, and a second select line (also referred to as a drain select line or a source select line) may be additionally disposed outside a second outermost word line.

At least one dummy word line may be additionally disposed between the first outermost word line and the first select line. At least one dummy word line may also be additionally disposed between the second outermost word line and the second select line.

When the memory device 110 has a memory block structure as illustrated in FIG. 3, a read operation and a program operation (write operation) may be performed in the unit of page, and an erase operation may be performed in the unit of memory block.

Figure 4:
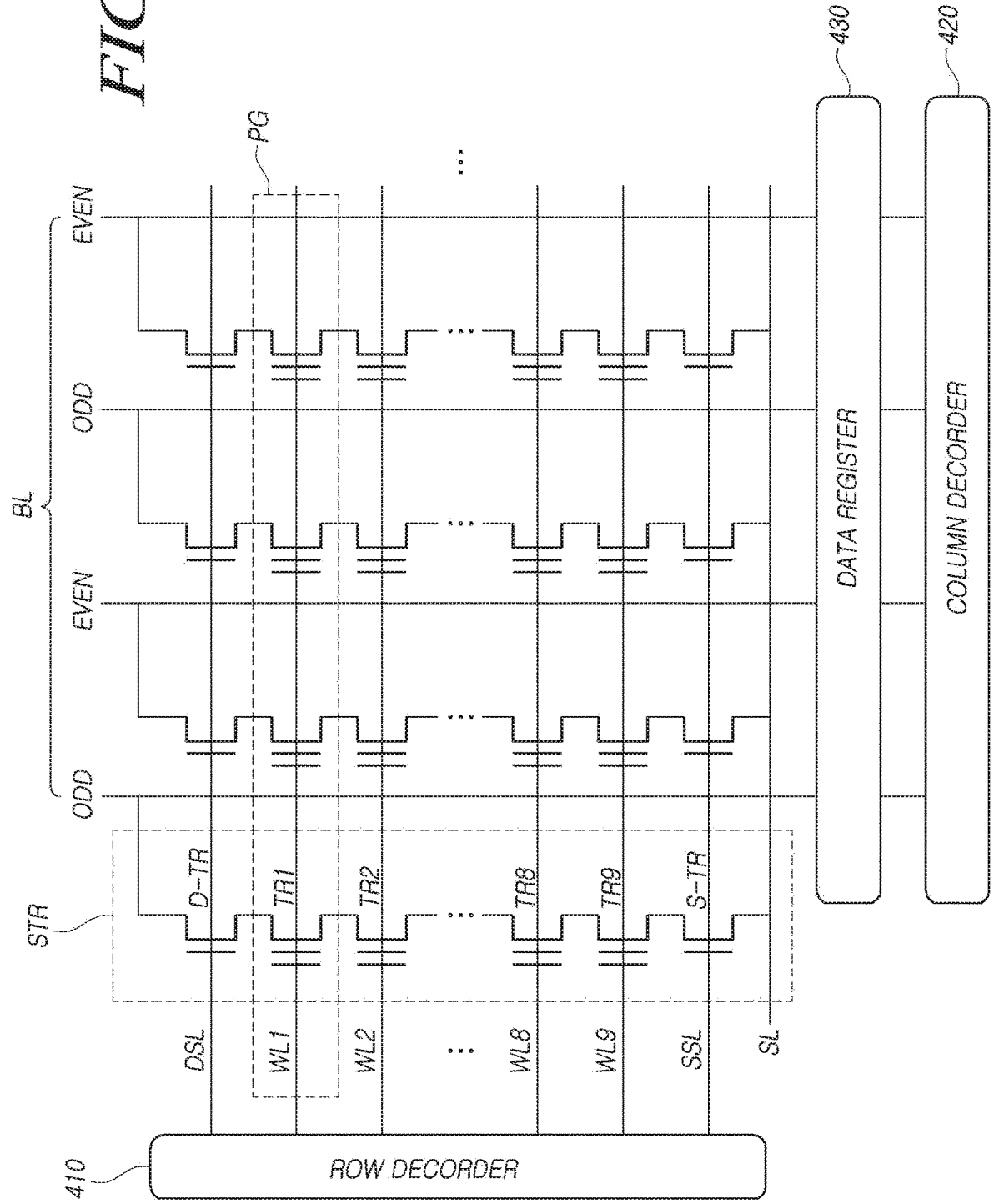
FIG. 4 is a diagram illustrating a structure of one string in a memory block of a memory device in accordance with an embodiment of the disclosure.

FIG. 4 is a diagram illustrating a structure of word lines WL and bit lines BL of the memory device 110 in accordance with an embodiment of the disclosure.

Referring to FIG. 4, in the memory device 110, there exist a core area in which memory cells MC are gathered and a remaining auxiliary area which supports the operation of the memory cell array 210.

The core area may be configured by pages PG and strings STR. In such a core area, a plurality of word lines WL1 to WL9 and a plurality of bit lines BL are disposed to intersect with each other.

The plurality of word lines WL1 to WL9 may be coupled with a row decoder 410, and the plurality of bit lines BL may be coupled with a column decoder 420. A data register 430 corresponding to the read and write circuit 230 may exist between the plurality of bit lines BL and the column decoder 420.

The plurality of word lines WL1 to WL9 correspond to a plurality of pages PG.

For example, as illustrated in FIG. 4, each of the plurality of word lines WL1 to WL9 may correspond to one page PG. However, in the case where the size of each of the plurality of word lines WL1 to WL9 is large, each of the plurality of word lines WL1 to WL9 may correspond to at least two (e.g., two or four) pages PG. Page PG is a minimum unit in performing a program operation and a read operation. In the program operation and the read operation, all memory cells MC in the same page PG may simultaneously perform the corresponding operations.

The plurality of bit lines BL may be coupled with the column decoder 420 while being identified as odd-numbered bit lines BL and even-numbered bit lines BL.

In order to access memory cells MC, first, an address may be entered into the core area through the row decoder 410 and the column decoder 420 via an input/output terminal, and may designate target memory cells. Designating target memory cells means accessing memory cells MC located at sites where the word lines WL1 to WL9 coupled with the row decoder 410 and the bit lines BL coupled with the column decoder 420 intersect with each other, to program data or read out programmed data.

The memory cells MC of a page PG in a first direction (e.g., the X-axis direction) are bundled (coupled) by a line used in common, which is referred to as a word line WL, and the memory cells MC of a string STR in a second direction (e.g., the Y-axis direction) are bundled by a line used in common, which is referred to as a bit line BL. Being bundled in common means that corresponding memory cells MC are structurally coupled with one another by the same material and also the same voltage is simultaneously applied to the memory cells MC when a voltage is applied thereto. Of course, as a memory cell MC which is coupled in series to a first memory cell MC and is located at an intermediate location or a last location is influenced by a voltage drop in a preceding memory cell MC, voltages applied to the first memory cell MC and the last memory cell MC may be slightly different from each other.

Since data is programmed and read via the data register 430 in all data processing operations of the memory device 110, the data register 430 plays a key role. If data processing of the data register 430 is late, all the other areas need to wait until the data register 430 completes the data processing. Also, if the performance of the data register 430 is degraded, the overall performance of the memory device 110 may be degraded.

Referring to the illustration of FIG. 4, in one string STR, a plurality of transistors TR1 to TR9 which are coupled with the plurality of word lines WL1 to WL9 may exist. Areas where the plurality of transistors TR1 to TR9 exist correspond to memory cells MC. Each of the plurality of transistors TR1 to TR9 includes a control gate CG and a floating gate FG as described above.

The plurality of word lines WL1 to WL9 include two outermost word lines WL1 and WL9. A first select line DSL may be additionally disposed outside a first outermost word line WL1 which is more adjacent to the data register 430 in terms of signal path between the two outermost word lines WL1 and WL9, and a second select line SSL may be additionally disposed outside the other second outermost word line WL9.

A first select transistor D-TR, which is on-off controlled by the first select line DSL, has only a gate electrode coupled with the first select line DSL and does not include a floating gate FG. A second select transistor S-TR, which is on-off controlled by the second select line SSL, has only a gate electrode coupled with the second select line SSL and does not include a floating gate FG.

The first select transistor D-TR serves as a switch which turns on or off the coupling between a corresponding string STR and the data register 430. The second select transistor S-TR serves as a switch which turns on or off the coupling between the corresponding string STR and a source line SL. That is to say, the first select transistor D-TR and the second select transistor S-TR are located at opposite ends of the corresponding string STR, and serve as gatekeepers which couple and decouple signals.

In a program operation, because it is necessary to fill electrons in a target memory cell MC of a bit line BL which is to be programmed, the memory system 100 turns on the first select transistor D-TR by applying a turn-on voltage Vcc to the gate electrode of the first select transistor D-TR, and turns off the second select transistor S-TR by applying a turn-off voltage (e.g., 0V) to the gate electrode of the second select transistor S-TR. The turn-on and turn-off voltages may be predetermined.

In a read operation or a verify operation, the memory system 100 turns on both the first select transistor D-TR and the second select transistor S-TR. Accordingly, since current may be discharged to the source line SL corresponding to the ground through the corresponding string STR, a voltage level of the bit line BL may be measured. However, in the read operation, there may be a time difference between on-off timings of the first select transistor D-TR and the second select transistor S-TR.

In an erase operation, the memory system 100 may supply a set voltage (e.g., +20V) to a substrate through the source line SL. In the erase operation, the memory system 100 floats both the first select transistor D-TR and the second select transistor S-TR, thereby providing infinite resistance. Accordingly, the memory system 100 is structured such that the first select transistor D-TR and the second select transistor S-TR do not function and electrons may operate due to a potential difference only between a floating gate FG and the substrate.

Figure 5:
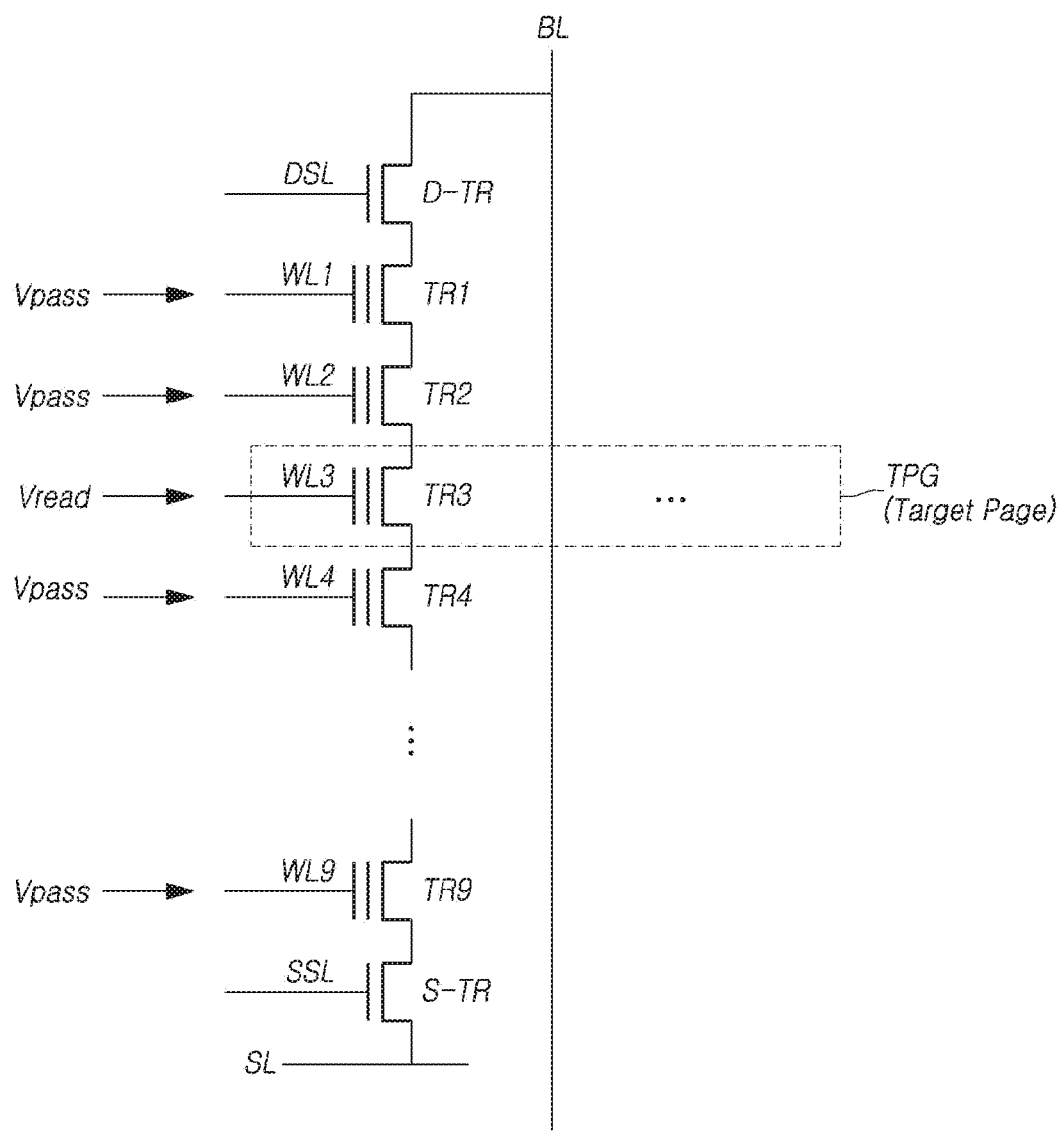
FIG. 5 is a diagram illustrating supply of voltages for a read operation of a memory device in accordance with an embodiment of the disclosure.

FIG. 5 is a diagram illustrating supply of voltages for a read operation of the memory device 110 in accordance with an embodiment of the disclosure. Hereinbelow, it is assumed that nine word lines WL1 to WL9 exist in one string STR and a third word line WL3 among the nine word lines WL1 to WL9 is a target word line.

Referring to FIG. 5, in a read operation of the memory device 110, both the first select transistor D-TR and the second select transistor S-TR are turned on. According to the above-described assumption, the third word line WL3 corresponding to a target page TPG for which the read operation is to be performed corresponds to the target word line.

When performing such a read operation, a read voltage Vread is applied to the third word line WL3 corresponding to the target word line. The read voltage Vread may include various voltage values depending on the number of distribution levels.

A pass voltage Vpass is applied to the remaining word lines WL1, WL2 and WL4 to WL9.

Hereafter, a transistor TR3 to which the read voltage Vread is applied is also referred to as a target transistor, and transistors TR1, TR2 and TR4 to TR9 to which the pass voltage Vpass is applied are referred to as pass transistors.

A memory cell MC to which the read voltage Vread is applied is also referred to as a selected memory cell, a target memory cell or a read memory cell. Memory cells MC to which the pass voltage Vpass is applied are also referred to as unselected memory cells or pass memory cells. These unselected memory cells (pass memory cells) may include programmed memory cells and may include erased memory cells.

A word line WL to which the read voltage Vread is applied is also referred to as a selected word line, a target word line or a read word line. Word lines WL to which the pass voltage Vpass is applied are also referred to as unselected word lines or pass word lines. These unselected word lines (pass word lines) may include word lines (programmed word lines) corresponding to programmed memory cells and may include word lines (erased word lines) corresponding to erased memory cells.

In the read operation, all the pass transistors TR1, TR2 and TR4 to TR9 which are located in the same string STR should always be in a state in which current may flow therethrough. In this way, a gate voltage which allows all the pass transistors TR1, TR2 and TR4 to TR9 to be turned on is referred to as the pass voltage Vpass. In other words, a gate voltage which allows all pass memory cells to be turned on is referred to as the pass voltage Vpass.

Figure 6:
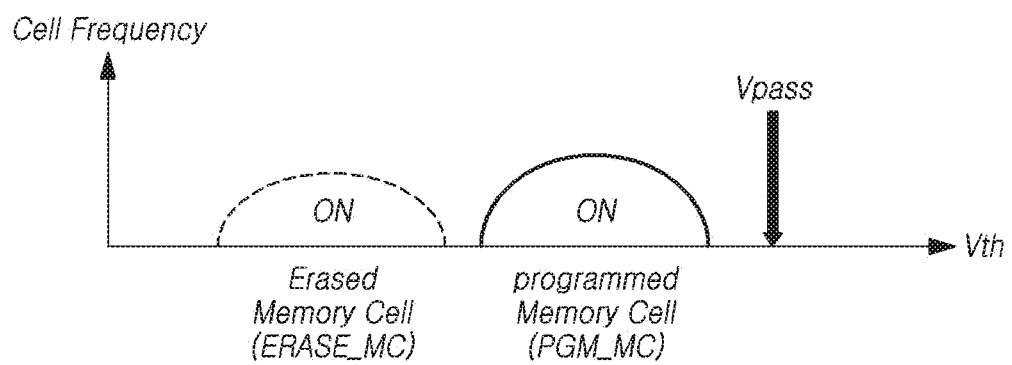
FIG. 6 is a diagram illustrating pass voltage for unselected memory cells (programmed memory cells and erased memory cells) in a memory device in accordance with an embodiment of the disclosure.

FIG. 6 is a diagram illustrating a representation of an example of a pass voltage Vpass for passing unselected memory cells (programmed memory cells PGM_MC and erased memory cells ERASE_MC) in the memory device 110 in accordance with an embodiment of the disclosure.

FIG. 6 illustrates a cell frequency for each threshold voltage of the programmed memory cells PGM_MC and a cell frequency for each threshold voltage of the erased memory cells ERASE_MC.

Referring to FIG. 6, the threshold voltage distribution of the programmed memory cells PGM_MC has a distribution of voltages overall higher than a distribution of voltages of the threshold voltage distribution of the erased memory cells ERASE_MC.

Describing again the pass voltage Vpass with reference to FIG. 6, regardless of whether all unselected memory cells (that is, pass memory cells) are programmed memory cells PGM_MC to which data is programmed or erased memory cells ERASE_MC from which data is erased, all the unselected memory cells (that is, pass memory cells) which are coupled to the string STR of a bit line BL should be in a state in which current may flow therethrough.

To this end, the pass voltage Vpass which has a sufficiently high voltage value should be applied to the gates of the transistors TR1, TR2 and TR4 to TR9 of all the unselected memory cells (that is, pass memory cells) which are coupled to the string STR of the bit line BL.

Since a read operation is performed in the unit of page PG, besides the target page TPG which is accessed, memory cells MC (that is, pass memory cells) corresponding to pages PG which are not accessed should be applied with the high pass voltage Vpass, and thus, the transistors TR1, TR2 and TR4 to TR9 of all the unselected memory cells (that is, pass memory cells) should not be turned off.

FIG. 7 is a diagram to assist in the explanation of pass voltage control in the memory system 100 in accordance with an embodiment of the disclosure.

The pass voltage Vpass should maintain at least a set voltage value to turn on all the unselected memory cells which are coupled to a target string, and at the same time, should be applied to all the word lines WL1, WL2 and WL4 to WL9 except the target word line WL3 among the plurality of word lines WL1 to WL9 in the memory block BLK.

The reason why the memory system 100 maintains the pass voltage Vpass at a sufficiently high voltage level is because it is not possible to be aware which threshold voltage (Vth) distribution the pass transistors TR1, TR2 and TR4 to TR9 have.

Even when the memory system 100 is aware of a threshold voltage distribution, the pass voltage Vpass should be set to be equal to or higher than a maximum threshold voltage in the threshold voltage distribution.

According to the illustration of FIG. 7, a threshold voltage of a second distribution level Level 2 corresponds to a voltage range higher than a threshold voltage of a first distribution level Level 1. Therefore, a pass voltage Vpass_L1 of a first voltage level by which memory cells MC having threshold voltages of the first distribution level Level 1 can be turned on may be lower than a pass voltage Vpass_L2 of a second voltage level by which memory cells MC having threshold voltages of the second distribution level Level 2 can be turned on.

As such, in the case where the pass voltage Vpass is individually and differently set depending on a distribution level of memory cells MC, voltage generation and supply operations may become complicated, and an additional circuit configuration for individually setting a pass voltage may be necessary.

Therefore, the memory system 100 may perform a read operation by uniformly setting the common pass voltage Vpass higher than threshold voltages which all memory cells MC have, in consideration of distribution levels (threshold voltage distribution levels) of all the memory cells MC.

Figure 8:
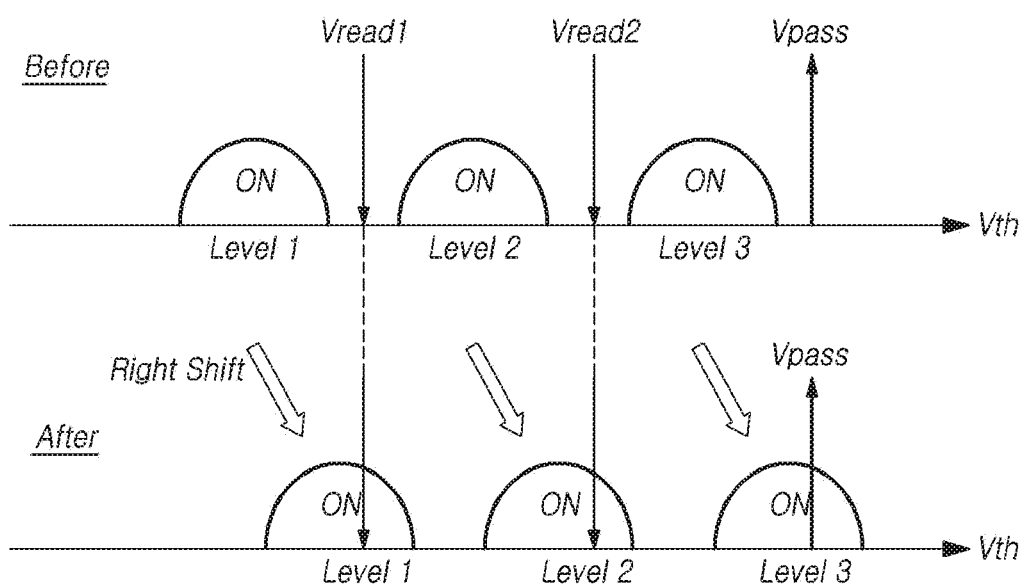
FIG. 8 is a diagram to assist in the explanation of a distribution shift phenomenon that occurs in the case a memory device with multi-level cells (MLCs) in accordance with an embodiment of the disclosure.
Figure 9:
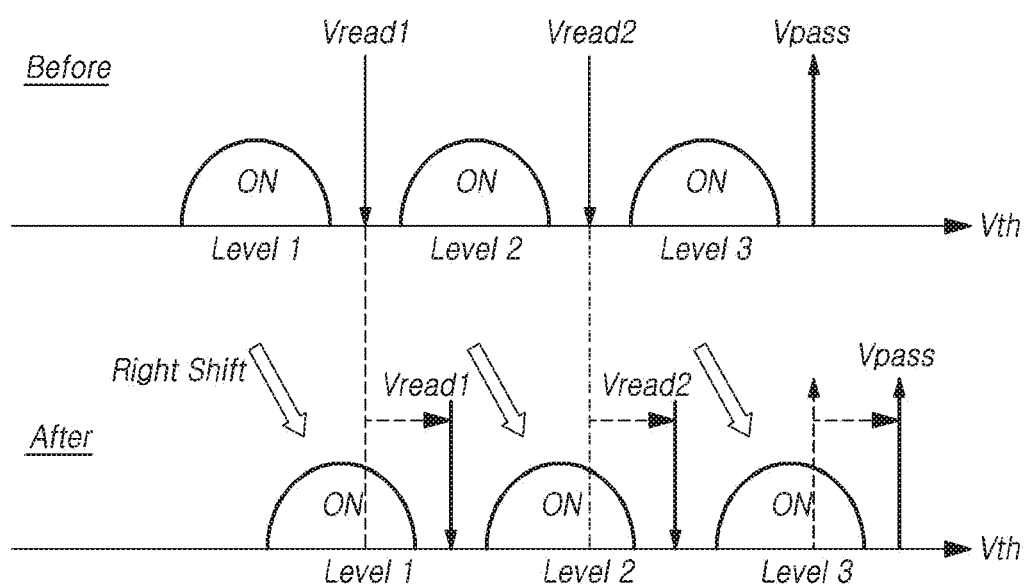
FIG. 9 is a diagram to assist in the explanation of a shift read operation for a normal read operation, when the distribution shift phenomenon occurs in a memory device with MLCs in accordance with an embodiment of the disclosure.

FIG. 8 is a diagram to assist in the explanation of a distribution shift phenomenon that occurs in the case where memory cells MC of the memory device 110 in accordance with an embodiment of the disclosure are multi-level cells (MLC). FIG. 9 is a diagram to assist in the explanation of a shift read operation for a normal read operation, when the distribution shift phenomenon occurs in the case where memory cells MC of the memory device 110 are MLCs, in accordance with an embodiment of the disclosure.

Referring to the illustration of FIG. 8, in the case where the memory cells MC of the memory device 110 are multi-level cells (MLC), there exist memory cells MC which have threshold voltages of a first distribution level Level 1, memory cells MC which have threshold voltages of a second distribution level Level 2 and memory cells MC which have threshold voltages of a third distribution level Level 3.

Referring to the illustration of FIG. 8, in a read operation, in the case of multi-level cells (MLC), the memory system 100 determines types and locations of distributions by employing results of reading the multi-level cells (MLC) using optional voltages (mainly, middle values Vread1 and Vread2) between the three distribution levels Level 1, Level 2 and Level 3. Also, in the read operation, the common pass voltage Vpass may be applied to unselected memory cells MC.

However, referring to the illustration of FIG. 8, in the memory system 100, even though the distributions have shifted rightward (Right Shift), in the case where the read operation is performed using the voltages Vread1 and Vread2 before the shift, a bit fail may occur.

Therefore, as illustrated in FIG. 9, in the case where the distributions have shifted rightward, the memory system 100 may normally perform the read operation, by shifting the voltages Vread1 and Vread2 rightward, that is, by performing up-shift read. In this regard, in order for the normal read operation, as illustrated in FIG. 9, the common pass voltage Vpass may also need to be up-shifted.

Figure 10:
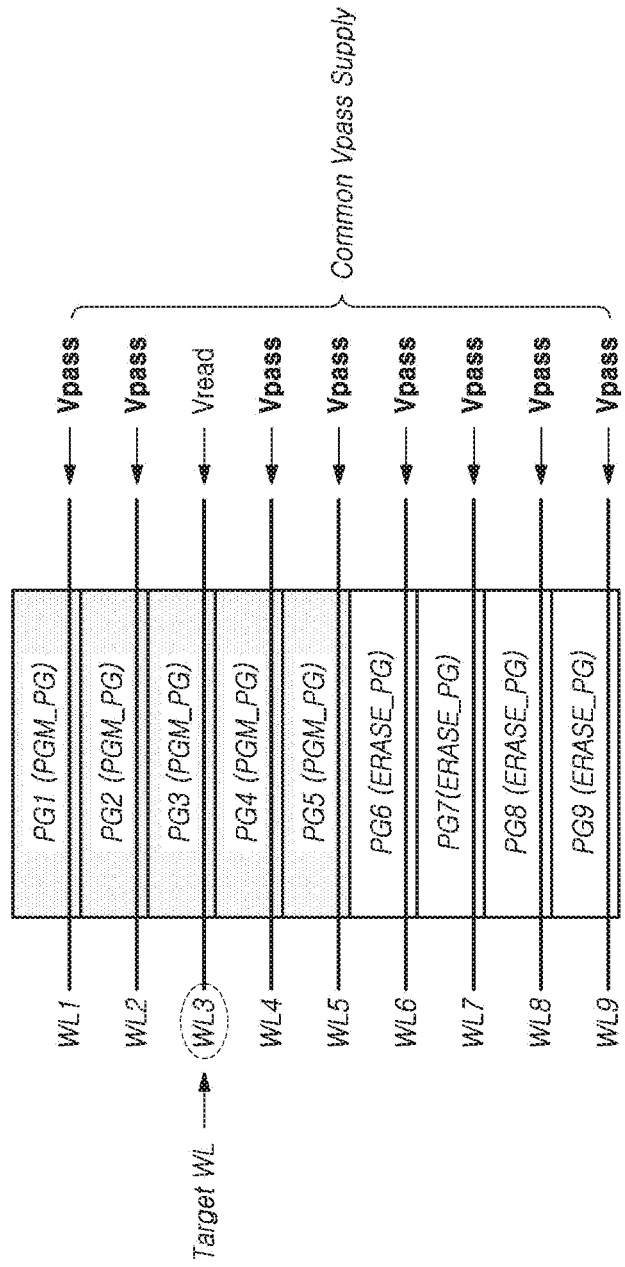
FIG. 10 is a diagram to assist in the explanation of a common pass voltage supply scheme for supplying the same common pass voltage to remaining word lines (excluding a target word line) in a memory device in accordance with an embodiment of the disclosure.

FIG. 10 is a diagram to assist in the explanation of a common pass voltage supply scheme for supplying the same common pass voltage Vpass to the other word lines WL1, WL2 and WL4 to WL9 (excluding a target word line Target WL), in the memory device 110 in accordance with an embodiment of the disclosure.

In the illustration of FIG. 10, first to fifth pages PG1 to PG5 of nine pages PG1 to PG9 are programmed pages PGM_PG, and sixth to ninth pages PG6 to PG9 of the nine pages PG1 to PG9 are erased pages ERASE_PG.

In the illustration of FIG. 10, the third page PG3 is a target page TPG selected for a read operation. That is to say, a third word line WL3 corresponding to the third page PG3 corresponds to the target word line Target WL.

Referring to the illustration of FIG. 10, in the read operation, a read voltage Vread is applied to the third word line WL3 corresponding to the target word line Target WL. The pass voltage Vpass is applied to the remaining word lines WL1, WL2 and WL4 to WL9.

As described above, all pass voltages Vpass applied to the remaining word lines WL1, WL2 and WL4 to WL9 are the same common pass voltage.

As such, in the case where a common pass voltage is used in a read operation, there is an advantage in that a pass voltage may be easily generated and supplied and a circuit configuration may be simplified.

The pass voltage Vpass has a high voltage value that is set to be equal to or higher than a maximum threshold voltage of unselected memory cells (pass memory cells). Due to this fact, the threshold voltages of transistors TR disposed in memory cells which are applied with the considerably high pass voltage Vpass may increase.

Accordingly, a distribution shift phenomenon as in FIGS. 8 and 9 may occur, and due to this fact, a read fail may occur and thus a read operation may not be properly performed. This phenomenon is referred to as a read disturbance.

Erased word lines corresponding to erased memory cells ERASE_MC may be frequently applied with the high pass voltage Vpass at a higher frequency than programmed word lines corresponding to programmed memory cells PGM_MC.

Due to this fact, changes in the threshold voltages of the erased memory cells ERASE_MC in erased pages ERASE_PG corresponding to second (erased) word lines WL6 to WL9 may be larger than changes in the threshold voltages of the programmed memory cells PGM_MC in programmed pages PGM_PG corresponding to first (programmed) word lines WL1, WL2, WL4 and WL5.

Therefore, the distribution shift phenomenon and the read disturbance phenomenon due to high voltage biasing by the pass voltage Vpass that occurs may be more serious in the erased memory cells ERASE_MC.

In consideration of these facts, embodiments of the disclosure may provide a differentiated pass voltage supply scheme that is different from the common pass voltage supply scheme.

While it is explained above that a fail due to a high voltage value of the pass voltage Vpass and a resultant abnormal operation phenomenon occur in a read operation, they may also occur in other operations (e.g., a program operation, an erase operation and the like) in which the pass voltage Vpass or a voltage of a similar use (a turn-on voltage of a transistor TR) is used.

Therefore, the differentiated pass voltage supply scheme described below in terms of a read operation, may be applied to other different types of operations (e.g., a program operation).

Figure 11:
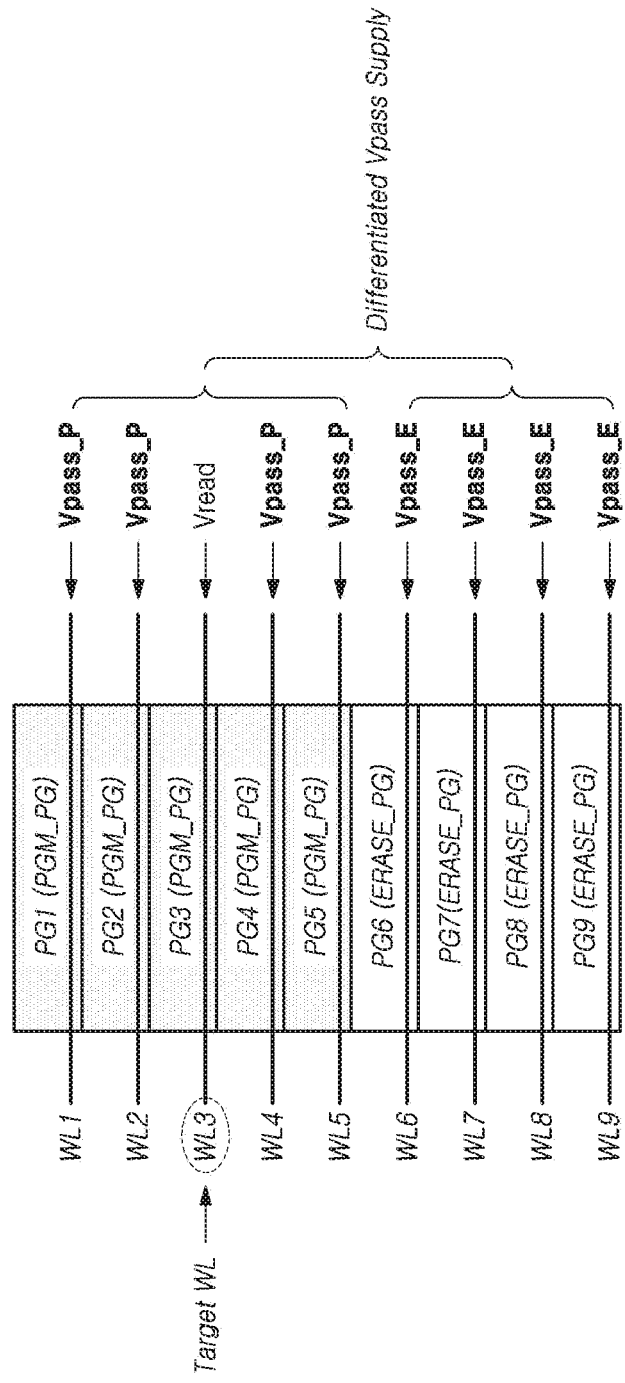
FIG. 11 is a diagram to assist in the explanation of a differentiated pass voltage supply scheme for supplying differentiated pass voltages to remaining word lines (excluding a target word line) to correct an operation error such as a read disturbance of a memory device in accordance with an embodiment of the disclosure.

FIG. 11 is a diagram to assist in the explanation of a differentiated pass voltage supply scheme for supplying differentiated pass voltages Vpass_P and Vpass_E to the other word lines WL1, WL2 and WL4 to WL9 except a target word line Target WL, to correct an operation error such as a read disturbance of the memory device 110 in accordance with an embodiment of the disclosure.

FIG. 11 is a diagram for exemplifying the differentiated pass voltage supply scheme in the memory state illustrated in FIG. 10.

Namely, first to fifth pages PG1 to PG5 of nine pages PG1 to PG9 are programmed pages PGM_PG, and sixth to ninth pages PG6 to PG9 of the nine pages PG1 to PG9 are erased pages ERASE_PG.

The third page PG3 is a target page TPG selected for a predetermined operation (e.g., a read operation or a program operation). That is to say, a third word line WL3 corresponding to the third page PG3 corresponds to the target word line Target WL.

For example, in a read operation, a read voltage Vread is applied to the target third word line WL3. A pass voltage Vpass is applied to the remaining word lines WL1, WL2 and WL4 to WL9.

However, in the case of the differentiated pass voltage supply scheme, the command pass voltage Vpass as in the common pass voltage supply scheme of FIG. 10 is not applied to the remaining word lines WL1, WL2 and WL4 to WL9.

In the case of the differentiated pass voltage supply scheme, the differentiated pass voltages Vpass_P and Vpass_E may be applied to the remaining word lines WL1, WL2 and WL4 to WL9.

Nevertheless, respectively different pass voltages are not individually applied to the remaining word lines WL1, WL2 and WL4 to WL9. Instead, the different pass voltages Vpass_P and Vpass_E may be applied for respective statuses of the remaining word lines WL1, WL2 and WL4 to WL9 (i.e., a programmed word line group corresponding to the programmed pages PGM_PG and an erased word line group corresponding to the erased pages ERASE_PG).

The memory device 110 of the memory system 100 in accordance with an embodiment of the disclosure may apply, in the set operation (e.g., a read operation), the different pass voltages Vpass_P and Vpass_E to one or more first word lines WL1, WL2, WL4 and WL5 and one or more second word lines WL6 to WL9 among the other word lines WL1, WL2 and WL4 to WL9.

The memory device 110 may include the memory cell array 210 in which the plurality of word lines WL1 to WL9 and the plurality of bit lines BL are disposed, and the voltage generation circuit 250 which outputs pass voltages Vpass to be applied to the one or more first word lines WL1, WL2, WL4 and WL5 and the one or more second word lines WL6 to WL9 among the other word lines WL1, WL2 and WL4 to WL9 for the set operation, as different voltage values Vpass_P and Vpass_E.

The memory controller 120 may include the memory interface 122 for communicating with the memory device 110 to which the differentiated pass voltages Vpass_P and Vpass_E are supplied, and the control circuit 123 which controls the different pass voltages Vpass_P and Vpass_E to be applied to the one or more first word lines WL1, WL2, WL4 and WL5 and the one or more second word lines WL6 to WL9 among the other word lines WL1, WL2 and WL4 to WL9, in the set operation of the memory device 110.

For example, the memory device 110 may apply the different pass voltage values Vpass_P and Vpass_E to the one or more first word lines WL1, WL2, WL4 and WL5 and the one or more second word lines WL6 to WL9, depending on whether each of pages corresponding to the one or more first word lines WL1, WL2, WL4 and WL5 and pages corresponding to the one or more second word lines WL6 to WL9 stores data.

In the case where the set operation of the memory device 110 is a read operation, the read voltage Vread may be applied to the third word line WL3 selected as the target word line Target WL, and the different pass voltages Vpass_P and Vpass_E may be applied to the one or more first word lines WL1, WL2, WL4 and WL5 and the one or more second word lines WL6 to WL9 among the other word lines WL1, WL2 and WL4 to WL9.

The one or more first word lines WL1, WL2, WL4 and WL5 described above correspond to a first word line group to which the same first pass voltage Vpass_P is applied. The one or more second word lines WL6 to WL9 correspond to a second word line group to which the same second pass voltage Vpass_E is applied. The second pass voltage Vpass_E has a voltage value different from the first pass voltage Vpass_P.

For example, the one or more first word lines WL1, WL2, WL4 and WL5 in the first word line group may correspond to programmed pages each including at least one programmed memory cell PGM_MC in which data is stored. The one or more second word lines WL6 to WL9 included in the second word line group may correspond to erased pages each including at least one erased memory cell ERASE_MC in which data is not stored.

In the case where at least two first word lines WL1, WL2, WL4 and WL5 are included in the first word line group, the at least two first word lines WL1, WL2, WL4 and WL5 may be disposed adjacent to each other. Some of the at least two first word lines WL1, WL2, WL4 and WL5 corresponding to programmed word lines may be disposed by being spaced apart from the rest. That is to say, an erased word line may exist between the at least two first word lines WL1, WL2, WL4 and WL5 corresponding to programmed word lines.

In the case where at least two second word lines WL6 to WL9 are included in the second word line group, the at least two second word lines WL6 to WL9 may be disposed adjacent to each other. Some of the at least two second word lines WL6 to WL9 corresponding to erased word lines may be disposed by being spaced apart from the rest. That is to say, a programmed word line may exist between the at least two second word lines WL6 to WL9 corresponding to erased word lines.

Figure 12:
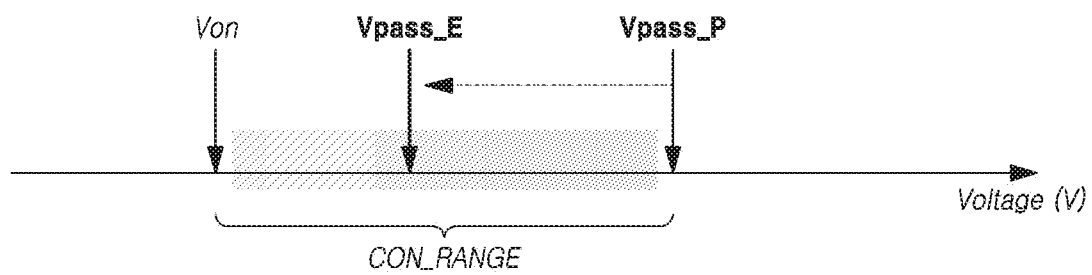
FIG. 12 is a diagram to assist in the explanation of the control of differentiated pass voltages in the case where a first pass voltage applied to programmed memory cells and a second pass voltage applied to erased memory cells are differentiated from each other, in a differentiated pass voltage supply scheme in accordance with an embodiment of the disclosure.

FIG. 12 is a diagram to assist in the explanation of the control of differentiated pass voltages in the case where a first pass voltage Vpass_P applied to programmed memory cells MC and a second pass voltage Vpass_E applied to erased memory cells MC are differentiated from each other, in the differentiated pass voltage supply scheme in accordance with an embodiment of the disclosure.

When a high pass voltage Vpass is applied to the remaining word lines WL1, WL2 and WL4 to WL9, the threshold voltages of memory cells which correspond to the remaining word lines WL1, WL2 and WL4 to WL9 and are unselected may increase due to the high pass voltage Vpass. In particular, increases in the threshold voltages of erased memory cells ERASE_MC among the unselected memory cells may be larger.

Erased word lines corresponding to the erased memory cells ERASE_MC may be frequently applied with the high pass voltage Vpass at a higher frequency than programmed word lines corresponding to programmed memory cells PGM_MC.

Due to this fact, changes in the threshold voltages of the erased memory cells ERASE_MC included in the erased pages ERASE_PG corresponding to the second word lines WL6 to WL9 corresponding to erased word lines may be larger than changes in the threshold voltages of the programmed memory cells PGM_MC included in the programmed pages PGM_PG corresponding to the first word lines WL1, WL2, WL4 and WL5 corresponding to programmed word lines.

Therefore, a distribution shift phenomenon and a read disturbance phenomenon due to high voltage biasing by the pass voltage Vpass that occur may be more serious in the erased memory cells ERASE_MC.

Because of this fact, as illustrated in FIG. 12, the memory device 110 may apply the first pass voltage Vpass_P to the one or more first word lines WL1, WL2, WL4 and WL5 corresponding to programmed word lines, and may apply the second pass voltage Vpass_E lower than the first pass voltage Vpass_P to the one or more second word lines WL6 to WL9 corresponding to erased word lines.

The control circuit 123 of the memory controller 120 may control the first pass voltage Vpass_P to be applied to the one or more first word lines WL1, WL2, WL4 and WL5 corresponding to programmed word lines, and may control the second pass voltage Vpass_E lower than the first pass voltage Vpass_P to be applied to the one or more second word lines WL6 to WL9 corresponding to erased word lines.

Under the control of the memory controller 120, the voltage generation circuit 250 in the memory device 110 may generate and output the first pass voltage Vpass_P to be applied to the one or more first word lines WL1, WL2, WL4 and WL5 corresponding to programmed word lines and the second pass voltage Vpass_E to be applied to the one or more second word lines WL6 to WL9 corresponding to erased word lines, as different voltage values. The second pass voltage Vpass_E has a voltage value lower than the first pass voltage Vpass_P.

In relation with the above-described pass voltage differentiation, because, among the unselected memory cells, the erased memory cells ERASE_MC have threshold voltage levels lower than those of the programmed memory cells PGM_MC (see FIG. 6), it may be possible to cause the second pass voltage Vpass_E applied to the one or more second word lines WL6 to WL9 corresponding to the erased memory cells ERASE_MC to be lower than the first pass voltage Vpass_P applied to the one or more first word lines WL1, WL2, WL4 and WL5 corresponding to the programmed memory cells PGM_MC.

By utilizing this fact, the second pass voltage Vpass_E applied to the one or more second word lines WL6 to WL9 corresponding to the erased memory cells ERASE_MC is set to be lower than the first pass voltage Vpass_P applied to the one or more first word lines WL1, WL2, WL4 and WL5 corresponding to the programmed memory cells PGM_MC.

Accordingly, rises in the threshold voltages of the erased memory cells ERASE_MC may be significantly suppressed. Due to this fact, afterwards, in the case where the erased memory cells ERASE_MC become programmed memory cells PGM_MC by writing of data, a predetermined operation (e.g., a read operation or a program operation) for the corresponding programmed memory cells PGM_MC may be more stably performed without an error, attributable to the threshold voltages less changed (increased) during a period before the writing of the data.

In the differentiated pass voltage supply environment, with respect to the erased memory cells ERASE_MC which may receive larger voltage stresses than the programmed memory cells PGM_MC, by further lowering the second pass voltage Vpass_E applied to the one or more second word lines WL6 to WL9 corresponding to the erased memory cells ERASE_MC, threshold voltage rise values in the erased memory cells ERASE_MC may be maintained below a certain voltage level. Therefore, an operation error (e.g., a read disturbance) likely to occur in an operation such as a read operation may be prevented or alleviated.

Among the unselected memory cells, the values of the increased threshold voltages of the erased memory cells ERASE_MC which may have threshold voltage increase amounts larger than the programmed memory cells PGM_MC may be maintained below a certain voltage level. Therefore, an operation error (e.g., a read disturbance) likely to occur in an operation such as a read operation may be prevented or alleviated.

Referring to FIG. 12, the second pass voltage Vpass_E applied to the one or more second word lines WL6 to WL9 corresponding to erased word lines may have a voltage value within a control range CON_RANGE that is equal to or higher than a maximum threshold voltage Von of at least one memory cell MC corresponding to the one or more second word lines WL6 to WL9 and lower than the first pass voltage Vpass_P.

In relation with the maximum threshold voltage Von, in the case where there exist at least two second word lines WL6 to WL9, a maximum value of threshold voltages respectively owned by at least two memory cells MC corresponding to the at least two second word lines WL6 to WL9 may correspond to the maximum threshold voltage Von which is the lower limit of the control range CON_RANGE.

As described above, since the second pass voltage Vpass_E applied to the one or more second word lines WL6 to WL9 corresponding to erased word lines is set within the above-described control range CON_RANGE, threshold voltages increased due to the second pass voltage Vpass_E may be maintained below a certain level while turning on memory cells corresponding to the one or more second word lines WL6 to WL9.

The second pass voltage Vpass_E applied to the one or more second word lines WL6 to WL9 corresponding to erased word lines may have a voltage value within the control range CON_RANGE, and this voltage value may be a fixed value that does not change.

As such, by using the second pass voltage Vpass_E applied to the one or more second word lines WL6 to WL9 corresponding to erased word lines, as a fixed value, the memory system 100 may more efficiently and easily implement the differentiated pass voltage supply.

In contrast to the configuration/arrangement described above, the second pass voltage Vpass_E applied to the one or more second word lines WL6 to WL9 corresponding to erased word lines may have a voltage value within the control range CON_RANGE, but this voltage value may be changed depending on a time or a situation.

As such, by changing the second pass voltage Vpass_E applied to the one or more second word lines WL6 to WL9 corresponding to erased word lines, depending on a time or a situation, the memory system 100 may adaptively implement voltage setting in conformity with an operating situation and, through this, may more sensitively implement pre-processing or post-processing of an operation error.

Figure 13:
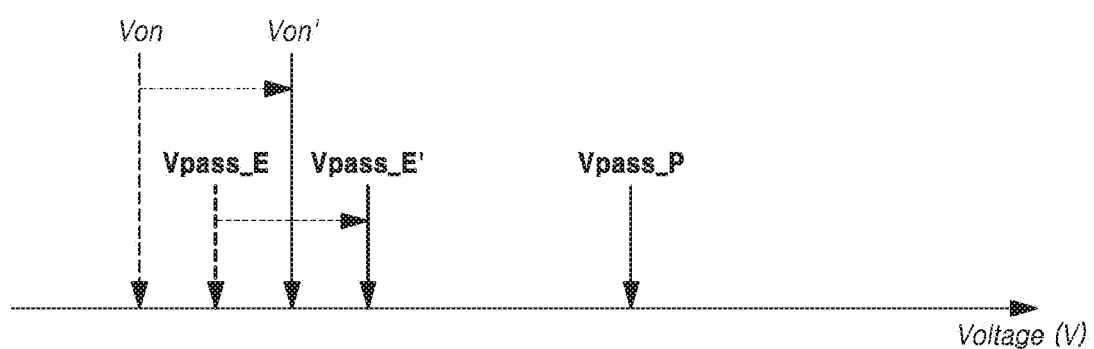
FIG. 13 is a diagram to assist in the explanation of the control of a second pass voltage when the distribution shift phenomenon occurs, in a differentiated pass voltage supply scheme in accordance with an embodiment of the disclosure.

FIG. 13 is a diagram to assist in the explanation of the control of the second pass voltage Vpass_E when the distribution shift phenomenon occurs, in the differentiated pass voltage supply scheme in accordance with an embodiment of the disclosure.

Even though, according to the above-described differentiated pass voltage supply scheme, the second pass voltage Vpass_E applied to the one or more second word lines WL6 to WL9 corresponding to erased word lines is set to be lower than the first pass voltage Vpass_P applied to the one or more first word lines WL1, WL2, WL4 and WL5 corresponding to programmed word lines and then a read operation or the like is performed, the second pass voltage Vpass_E is a voltage higher than the threshold voltages of the erased memory cells ERASE_MC corresponding to the one or more second word lines WL6 to WL9 corresponding to erased word lines.

Therefore, the threshold voltages of the erased memory cells ERASE_MC corresponding to the one or more second word lines WL6 to WL9 corresponding to erased word lines cannot help but rise.

In consideration of this fact, the memory system 100 in accordance with an embodiment of the disclosure may perform adaptively differentiated pass voltage control depending on a change in threshold voltages or the distribution thereof.

According to the adaptive differentiated pass voltage control, the second pass voltage Vpass_E applied to the one or more second word lines WL6 to WL9 corresponding to erased word lines may be changed when a maximum threshold voltage Von of at least one memory cell ERASE_MC corresponding to the one or more second word lines WL6 to WL9 varies.

For example, referring to FIG. 13, if a second pass voltage Vpass_E becomes lower than a variable maximum threshold voltage Von' as a maximum threshold voltage Von of at least one memory cell ERASE_MC corresponding to the one or more second word lines WL6 to WL9, the second pass voltage Vpass_E is reset to a second pass voltage Vpass_E' which is equal to or higher than the variable maximum threshold voltage Von'. The reset second pass voltage Vpass_E' should be lower than the first pass voltage Vpass_P.

In the same manner, as the threshold voltages of the erased memory cells ERASE_MC corresponding to the one or more second word lines WL6 to WL9 corresponding to erased word lines, rise as described above, the threshold voltages of the programmed memory cells PGM_MC corresponding to the one or more first word lines WL1, WL2, WL4 and WL5 corresponding to programmed word lines cannot help but rise as well. Namely, the threshold voltage (Vth) of a transistor TR disposed in at least one memory cell MC among the memory cells PGM_MC and ERASE_MC which are applied with the first and second pass voltages Vpass_P and Vpass_E according to a set operation of the memory device 110 may vary.

Therefore, according to the adaptive differentiated pass voltage control, in the same manner as the second pass voltage Vpass_E applied to the one or more second word lines WL6 to WL9 corresponding to erased word lines is reset, the first pass voltage Vpass_P applied to the one or more first word lines WL1, WL2, WL4 and WL5 corresponding to programmed word lines may be reset.

By the above-described adaptive differentiated pass voltage control, the memory system 100 may control the differentiated pass voltages Vpass_P and Vpass_E in response to a change in the threshold voltages of memory cells MC or a distribution thereof, thereby preventing a read fail or the like even when the threshold voltages or the distribution thereof varies and thus enabling a normal read operation.

In the following, methods in which the memory device 110 distinguishes an erased word line and a programmed word line for the differentiated pass voltage supply and control are described as examples.

The memory controller 120 may transmit pass voltage control information to the memory device 110, and the memory device 110 may receive the pass voltage control information and based thereon may apply the different pass voltages Vpass_P and Vpass_E to the one or more first word lines WL1, WL2, WL4 and WL5 and the one or more second word lines WL6 to WL9.

For example, the pass voltage control information may include most recent program location information. The most recent program location information may include information indicating a most recently programmed page before performing a set operation of the memory device 110 or a word line (a most recently programmed word line) corresponding to the most recently programmed page.

A programmed page may mean a page in which at least one memory cell among a plurality of memory cells is programmed. The fact that a memory cell is programmed may mean that data is stored in the memory cell.

If only one programmed page exists among a plurality of pages in a corresponding memory block BLK, the one programmed page is a most recently programmed page. If at least two programmed pages exist among a plurality of pages in a corresponding memory block BLK, a programmed page which is located last in terms of location among the at least two programmed pages may be a most recently programmed page. That is to say, a most recently programmed page may be a programmed page adjacent to an erased page.

For another example, the pass voltage control information may include boundary erase location information. The boundary erase location information may include information indicating an erased page adjacent to a most recently programmed page before performing a set operation of the memory device 110 or a word line (an erased word line) corresponding to the adjacent erased page.

Figure 14:
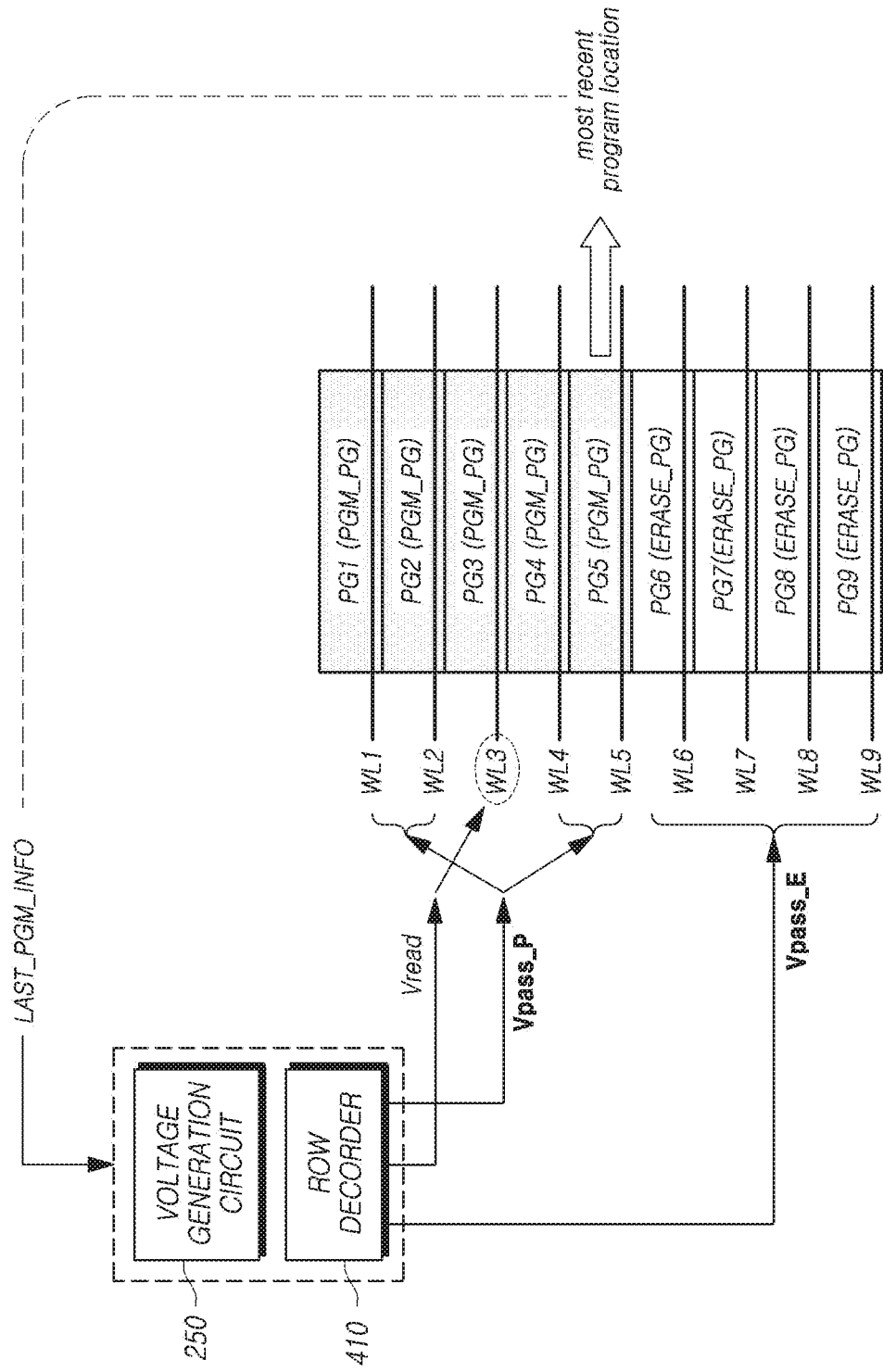
FIG. 14 is a diagram to assist in the explanation of supply of differentiated pass voltages from a voltage generation circuit, based on most recent program location information in accordance with an embodiment of the disclosure.

FIG. 14 is a representation of an example of a diagram to assist in the explanation of the supply of differentiated pass voltages from the voltage generation circuit 250, based on most recent program location information LAST_PGM_INFO, in the memory device 110 in accordance with an embodiment of the disclosure.

Referring to FIG. 14, the memory device 110 may apply different pass voltages Vpass_P and Vpass_E to the one or more first word lines WL1, WL2, WL4 and WL5 and the one or more second word lines WL6 to WL9, based on the most recent program location information LAST_PGM_INFO before performing a read operation.

For example, the most recent program location information LAST_PGM_INFO before performing a read operation may be identification information such as address information, may be information indicating a most recently programmed page PG5 meaning a page which is programmed most recently before performing the read operation, may be information indicating a most recently programmed word line WL5 corresponding to the most recently programmed page PG5, or may be information indicating a programmed memory cell PGM_MC which is programmed most recently in the most recently programmed page PG5.

The most recent program location information LAST_PGM_INFO may be inputted to one of the voltage generation circuit 250 and the row decoder 410 included in the memory device 110.

The voltage generation circuit 250 and the row decoder 410 in the memory device 110 may output a read voltage Vread to be applied to a target word line, and, by recognizing a most recently programmed location before the current read operation, based on the most recent program location information LAST_PGM_INFO, may output a first pass voltage Vpass_P to first word lines WL1, WL2, WL4 and WL5 corresponding to programmed pages PGM_PG and output a 20 second pass voltage Vpass_E lower than the first pass voltage Vpass_P to second word lines WL6 to WL9 corresponding to erased pages ERASE_PG.

The read voltage Vread is applied to a target word line WL3, the first pass voltage Vpass_P is applied to the one or more first word lines WL1, WL2, WL4 and WL5 corresponding to programmed word lines, and the second pass voltage Vpass_E is applied to the one or more second word lines WL6 to WL9 corresponding to erased word lines.

As described above, the memory device 110 may easily distinguish and recognize the programmed pages PGM_PG and the erased pages ERASE_PG by recognizing a most recent program location before the current read operation, based on the most recent program location information LAST_PGM_INFO.

In other words, the memory device 110 may easily recognize the first word lines WL1, WL2, WL4 and WL5 corresponding to programmed word lines to be applied with the first pass voltage Vpass_P and the second word lines WL6 to WL9 corresponding to erased word lines to be applied with the second pass voltage Vpass_E, based on the most recent program location information LAST_PGM_INFO.

Figure 15:
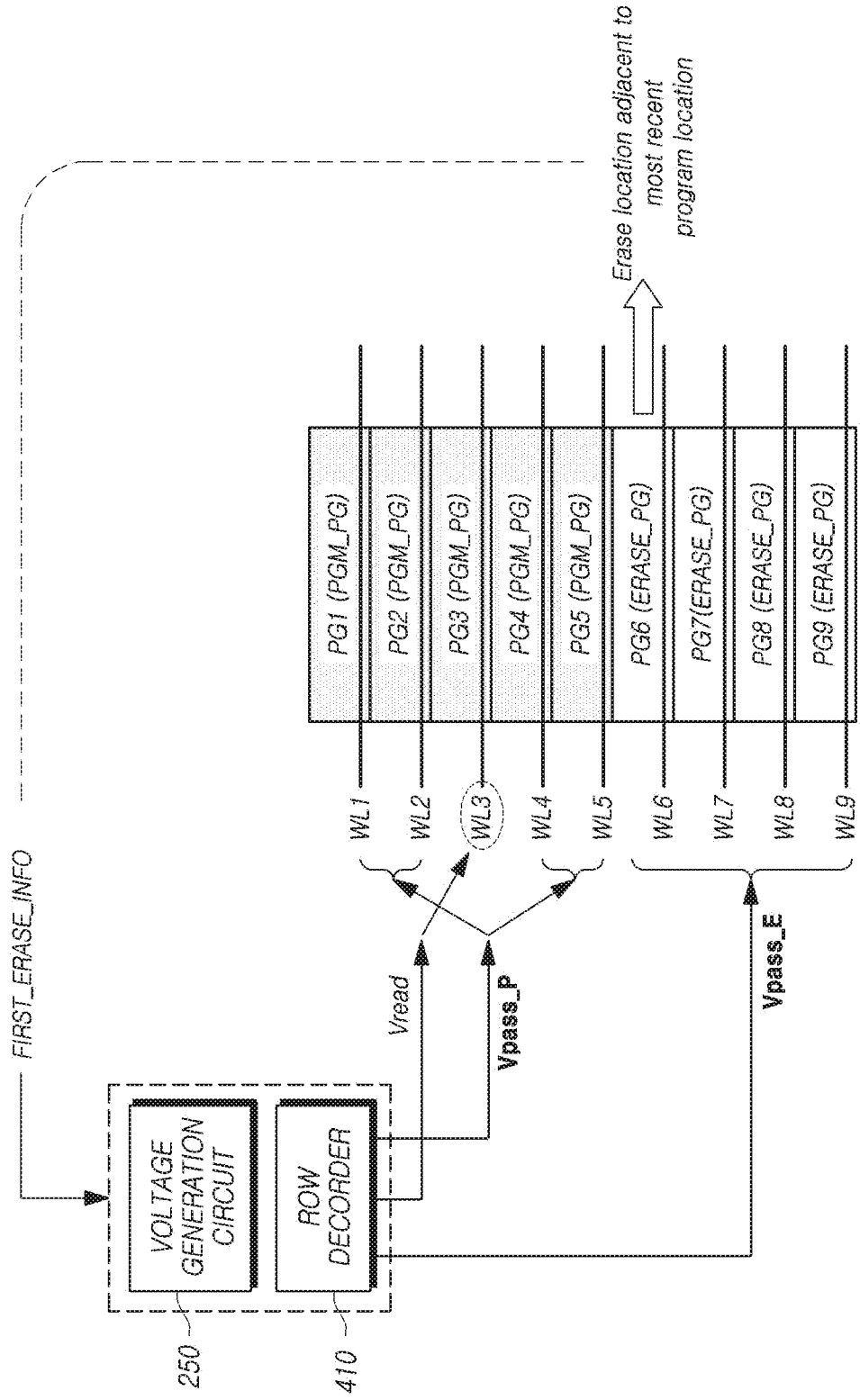
FIG. 15 is a diagram to assist in the explanation of supply of differentiated pass voltages from a voltage generation circuit, based on boundary erase location information in accordance with an embodiment of the disclosure.

FIG. 15 is a diagram to assist in the explanation of the supply of differentiated pass voltages, based on boundary erase location information FIRST_ERASE_INFO from the voltage generation circuit 250, in the memory device 110 in accordance with an embodiment of the disclosure.

Referring to FIG. 15, the memory device 110 may apply different pass voltages Vpass_P and Vpass_E to one or more first word lines WL1, WL2, WL4 and WL5 and one or more second word lines WL6 to WL9, based on the boundary erase location information FIRST_ERASE_INFO before performing a set operation.

For example, the boundary erase location information FIRST_ERASE_INFO before performing a set operation may be identification information such address information, may be information indicating a first erased page PG6 adjacent to a most recently programmed page PG5 before performing the set operation, may be information indicating a first erased word line WL6 corresponding to the first erased page PG6, or may be information indicating an erased memory cell ERASE_MC corresponding to the first erased word line WL6.

The boundary erase location information FIRST_ERASE_INFO may be inputted to one of the voltage generation circuit 250 and the row decoder 410 included in the memory device 110.

The voltage generation circuit 250 and the row decoder 410 in the memory device 110 may output a read voltage Vread to be applied to a target word line, and, by recognizing a first erase state page location PG6 most adjacent to a most recently programmed location before a current read operation, based on the boundary erase location information FIRST_ERASE_INFO, may output a first pass voltage Vpass_P to the first word lines WL1, WL2, WL4 and WL5 corresponding to programmed pages PGM_PG and output a second pass voltage Vpass_E lower than the first pass voltage Vpass_P to the second word lines WL6 to WL9 corresponding to erased pages ERASE_PG.

The read voltage Vread is applied to a target word line WL3, the first pass voltage Vpass_P is applied to the one or more first word lines WL1, WL2, WL4 and WL5 corresponding to programmed word lines, and the second pass voltage Vpass_E is applied to the one or more second word lines WL6 to WL9 corresponding to erased word lines.

As described above, the memory device 110 may easily distinguish and recognize the programmed pages PGM_PG and the erased pages ERASE_PG by recognizing pages PG6 to PG9 in erased states before the current read operation, based on the boundary erase location information FIRST_ERASE_INFO.

In other words, the memory device 110 may easily recognize the first word lines WL1, WL2, WL4 and WL5 corresponding to programmed word lines to be applied with the first pass voltage Vpass_P and the second word lines WL6 to WL9 corresponding to erased word lines to be applied with the second pass voltage Vpass_E, based on the boundary erase location information FIRST_ERASE_INFO.

Figure 16:
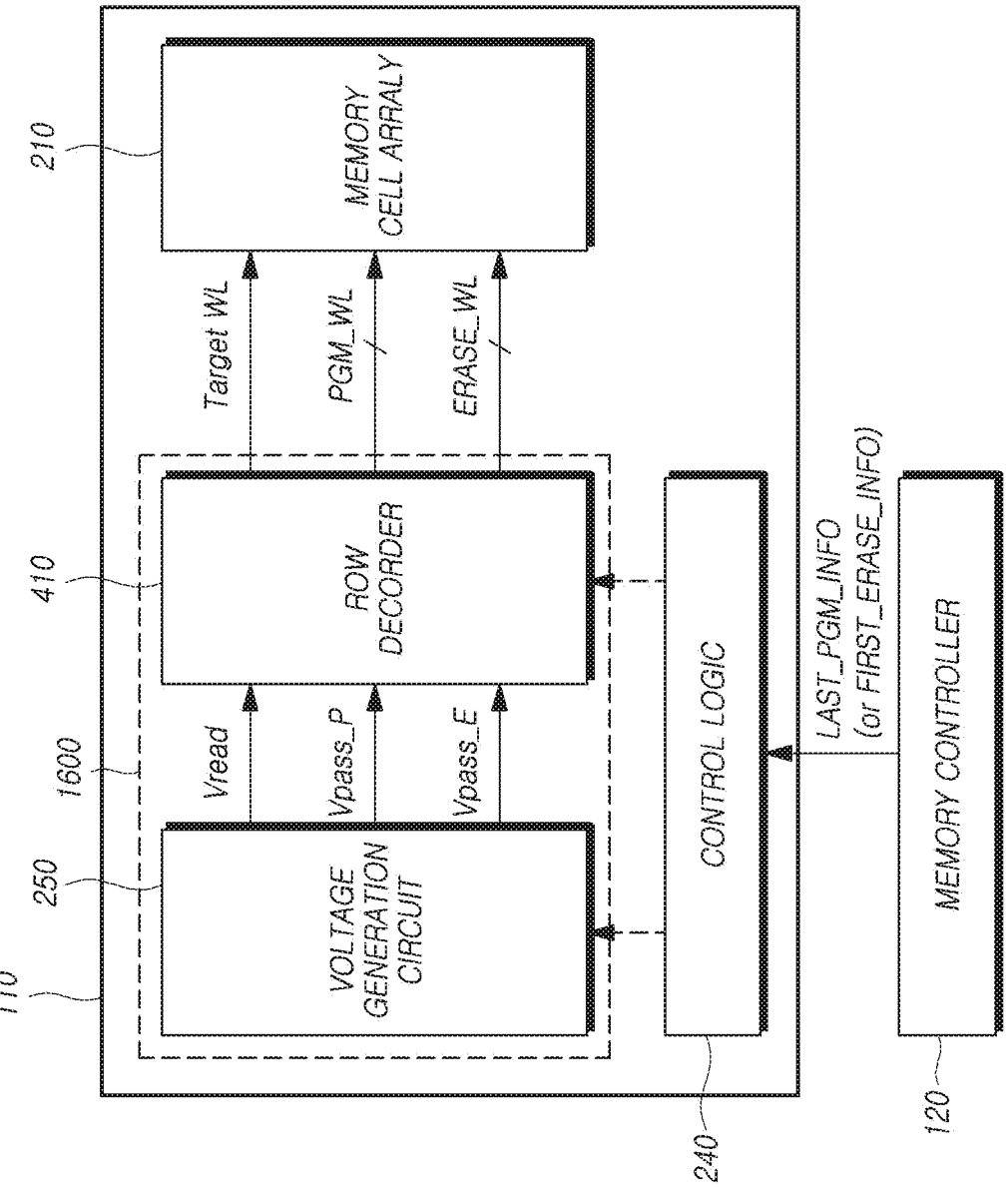
FIG. 16 is a diagram illustrating a configuration of a differentiated pass voltage supply system in a memory system in accordance with an embodiment of the disclosure.

FIG. 16 is a diagram illustrating a configuration of a differentiated pass voltage supply system in the memory system 100 in accordance with an embodiment of the disclosure.

Referring to FIG. 16, the memory system 100 may include the memory device 110 and the memory controller 120 for the differentiated pass voltage supply.

The memory device 110 may include the memory cell array 210 in which the plurality of word lines WL1 to WL9 and the plurality of bit lines BL are disposed, and a voltage output circuit 1600 which outputs different pass voltages Vpass_P and Vpass_E to one or more first word lines WL1, WL2, WL4 and WL5 and one or more second word lines WL6 to WL9 among the other word lines WL1, WL2 and WL4 to WL9 for a set operation, among the plurality of word lines WL1 to WL9.

The voltage output circuit 1600 may include the voltage generation circuit 250 which generates and outputs a read voltage Vread and the differentiated pass voltages Vpass_P and Vpass_E, and the row decoder 410 which outputs the read voltage Vread to the selected target word line WL3 for a read operation and outputs the differentiated pass voltages Vpass_P and Vpass_E to the one or more first word lines WL1, WL2, WL4 and WL5 corresponding to programmed word lines PGM_WL and the one or more second word lines WL6 to WL9 corresponding to erased word lines ERASE_WL.

The voltage output circuit 1600 may output the first pass voltage Vpass_P to the one or more first word lines WL1, WL2, WL4 and WL5 corresponding to the programmed word lines PGM_WL.

The voltage output circuit 1600 may output the second pass voltage Vpass_E lower than the first pass voltage Vpass_P to the one or more second word lines WL6 to WL9 corresponding to the erased word lines ERASE_WL.

As described above, the one or more first word lines WL1, WL2, WL4 and WL5 may correspond to the programmed word lines PGM_WL corresponding to programmed memory cells PGM_MC. The one or more second word lines WL6 to WL9 may correspond to the erased word lines ERASE_WL corresponding to erased memory cells ERASE_MC.

The memory device 110 may perform the differentiated pass voltage supply by receiving pass voltage control information including most recent program location information LAST_PGM_INFO or boundary erase location information FIRST_ERASE_INFO from the memory controller 120.

To this end, for instance, the memory controller 120 may transmit the pass voltage control information including the most recent program location information LAST_PGM_INFO indicating a most recently programmed page PG5 before performing a set operation or a most recently programmed word line WL5 corresponding to the most recently programmed page PG5, to the memory device 110. The memory device 110 may apply the different pass voltages Vpass_P and Vpass_E to the one or more first word lines WL1, WL2, WL4 and WL5 and the one or more second word lines WL6 to WL9, based on the most recent program location information LAST_PGM_INFO.

Alternatively, the memory controller 120 may transmit the pass voltage control information including the boundary erase location information FIRST_ERASE_INFO indicating a first erased page PG6 adjacent to a most recently programmed page PG5 before performing a set operation or a first erased word line WL6 corresponding to the first erased page PG6, to the memory device 110. The memory device 110 may apply the different pass voltages Vpass_P and Vpass_E to the one or more first word lines WL1, WL2, WL4 and WL5 and the one or more second word lines WL6 to WL9, based on the boundary erase location information FIRST_ERASE_INFO.

The memory controller 120 may transmit the pass voltage control information including the most recent program location information LAST_PGM_INFO or the boundary erase location information FIRST_ERASE_INFO, to the memory device 110 in each set operation of the memory device 110.

In an embodiment, the memory controller 120 may not transmit the pass voltage control information including the most recent program location information LAST_PGM_INFO or the boundary erase location information FIRST_ERASE_INFO, in each set operation of the memory device 110. Instead, the memory controller 120 may transmit the pass voltage control information including the most recent program location information LAST_PGM_INFO or the boundary erase location information FIRST_ERASE_INFO, to the memory device 110 only upon occurrence of an event (that is, when a change in a most recent program location or an erase location adjacent thereto occurs).

Namely, when the most recent program location information LAST_PGM_INFO or the boundary erase location information FIRST_ERASE_INFO is changed, the memory controller 120 may store the changed most recent program location information LAST_PGM_INFO or the changed boundary erase location information FIRST_ERASE_INFO, and in a set operation of the memory device 110, in the case where there is a history that the pass voltage control information including the changed most recent program location information LAST_PGM_INFO or the changed boundary erase location information FIRST_ERASE_INFO has been transmitted, may omit the transmission of the pass voltage control information including the changed most recent program location information LAST_PGM_INFO or the changed boundary erase location information FIRST_ERASE_INFO. In the case where there is no history that the pass voltage control information including the changed most recent program location information LAST_PGM_INFO or the changed boundary erase location information FIRST_ERASE_INFO has been transmitted, the memory controller 120 may transmit the pass voltage control information including the changed most recent program location information LAST_PGM_INFO or the changed boundary erase location information FIRST_ERASE_INFO.

The control circuit 123 of the memory controller 120 may transmit the most recent program location information LAST_PGM_INFO or the boundary erase location information FIRST_ERASE_INFO, before performing a set operation, to the memory device 110 through the memory interface 122.

Depending on the most recent program location information LAST_PGM_INFO or the boundary erase location information FIRST_ERASE_INFO transmitted to the memory device 110, the first pass voltage Vpass_P may be applied to the one or more first word lines WL1, WL2, WL4 and WL5, and the second pass voltage Vpass_E may be applied to the one or more second word lines WL6 to WL9.

Due to changes in the threshold voltages of the memory cells MC in the memory device 110, at least one of the first pass voltage Vpass_P applied to the one or more first word lines WL1, WL2, WL4 and WL5 corresponding to programmed word lines PGM_W and the second pass voltage Vpass_E applied to the one or more second word lines WL6 to WL9 corresponding to erased word lines ERASE_W may be changed.

Referring to FIG. 16, the memory device 110 may further include the control logic 240 which receives the most recent program location information LAST_PGM_INFO or the boundary erase location information FIRST_ERASE_INFO from the memory controller 120.

Depending on the most recent program location information LAST_PGM_INFO or the boundary erase location information FIRST_ERASE_INFO received by the control logic 240 from the memory controller 120, the voltage output circuit 1600 may output the first pass voltage Vpass_P to the one or more first word lines WL1, WL2, WL4 and WL5, and may output the second pass voltage Vpass_E different from the first pass voltage Vpass_P to the one or more second word lines WL6 to WL9.

The control logic 240 may transfer the most recent program location information LAST_PGM_INFO or the boundary erase location information FIRST_ERASE_INFO to the row decoder 410 in the voltage output circuit 1600.

Alternatively, the control logic 240 may transfer identification information (e.g., address information) on the programmed word lines PGM_W and the erased word lines ERASE_W, to the row decoder 410, based on the most recent program location information LAST_PGM_INFO or the boundary erase location information FIRST_ERASE_INFO.

The control logic 240 may also provide information on a change amount of the first pass voltage Vpass_P and/or the second pass voltage Vpass_E, to the voltage generation circuit 250 in the voltage output circuit 1600, depending on information on changes in the threshold voltages of the memory cells MC.

The control logic 240 may directly obtain the information on changes in the threshold voltages of the memory cells MC or may receive the information on changes in the threshold voltages of the memory cells MC, from the memory controller 120. The changes in the threshold voltages of the memory cells MC may be detected in any suitable way.

As described above, since the differentiated pass voltage supply is implemented in the memory device 110 as the memory controller 120 transmits the most recent program location information LAST_PGM_INFO or the boundary erase location information FIRST_ERASE_INFO to the memory device 110, the differentiated pass voltage supply may be more efficiently controlled.

Figure 17:
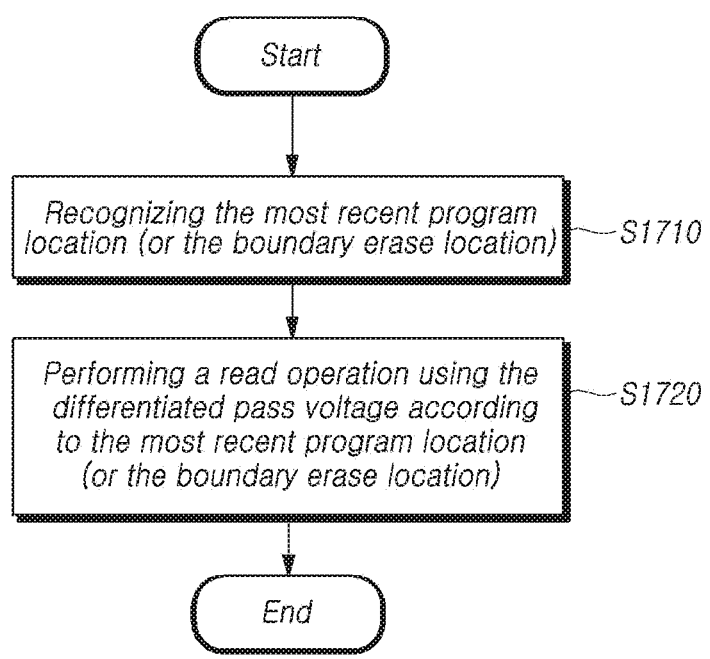
FIG. 17 is a flow chart to assist in the explanation of an operation method for supplying differentiated pass voltages in a memory system in accordance with an embodiment of the disclosure.

FIG. 17 is a flow chart to assist in the explanation of an operation method for supplying differentiated pass voltages in the memory system 100 in accordance with an embodiment of the disclosure.

Referring to FIG. 17, a method for operating the memory system 100 may include step S1710 of recognizing a most recent program location or a boundary erase location adjacent thereto and step S1720 of performing a read operation using differentiated pass voltages depending on the most recent program location or the boundary erase location.

At step S1710, the memory device 110 may recognize a most recently programmed word line WL5 corresponding to a most recently programmed page PG5 among the plurality of word lines WL1 to WL9 or recognize a first erased word line WL6 meaning an erased word line WL6 most adjacent to the most recently programmed word line WL5.

At step S1720, in a read operation, the memory device 110 may apply the read voltage Vread to a target word line Target WL among the plurality of word lines WL1 to WL9, and, based on a result of recognizing the most recently programmed word line WL5, may apply the different pass voltages Vpass_P and Vpass_E to the one or more first word lines WL1, WL2, WL4 and WL5 corresponding to one or more programmed memory cells PGM_MC and the one or more second word lines WL6 to WL9 corresponding to one or more erased memory cells ERASE_MC among the other word lines WL1, WL2 and WL4 to WL9 except the target word line WL3 among the plurality of word lines WL1 to WL9.

At step S1720, the memory device 110 may apply the first pass voltage Vpass_P to the one or more first word lines WL1, WL2, WL4 and WL5 recognized as the programmed word lines PGM_WL, and may apply the second pass voltage Vpass_E lower than the first pass voltage Vpass_P to the one or more second word lines WL6 to WL9 recognized as the erased word lines EREASE_WL.

At step S1720, the memory controller 120 may transmit the most recent program location information LAST_PGM_INFO or the boundary erase location information FIRST_ ERASE_INFO to the memory device 110. The memory device 110 may recognize the most recently programmed word line WL5 or the first erased word line WL6 based on the most recent program location information LAST_PGM_INFO or the boundary erase location information FIRST_ ERASE_INFO, and may apply the different pass voltages Vpass_P and Vpass_E to the one or more first word lines WL1, WL2, WL4 and WL5 recognized as the programmed word lines PGM_WL and the one or more second word lines WL6 to WL9 recognized as the erased word lines EREASE_WL.

Figure 18:
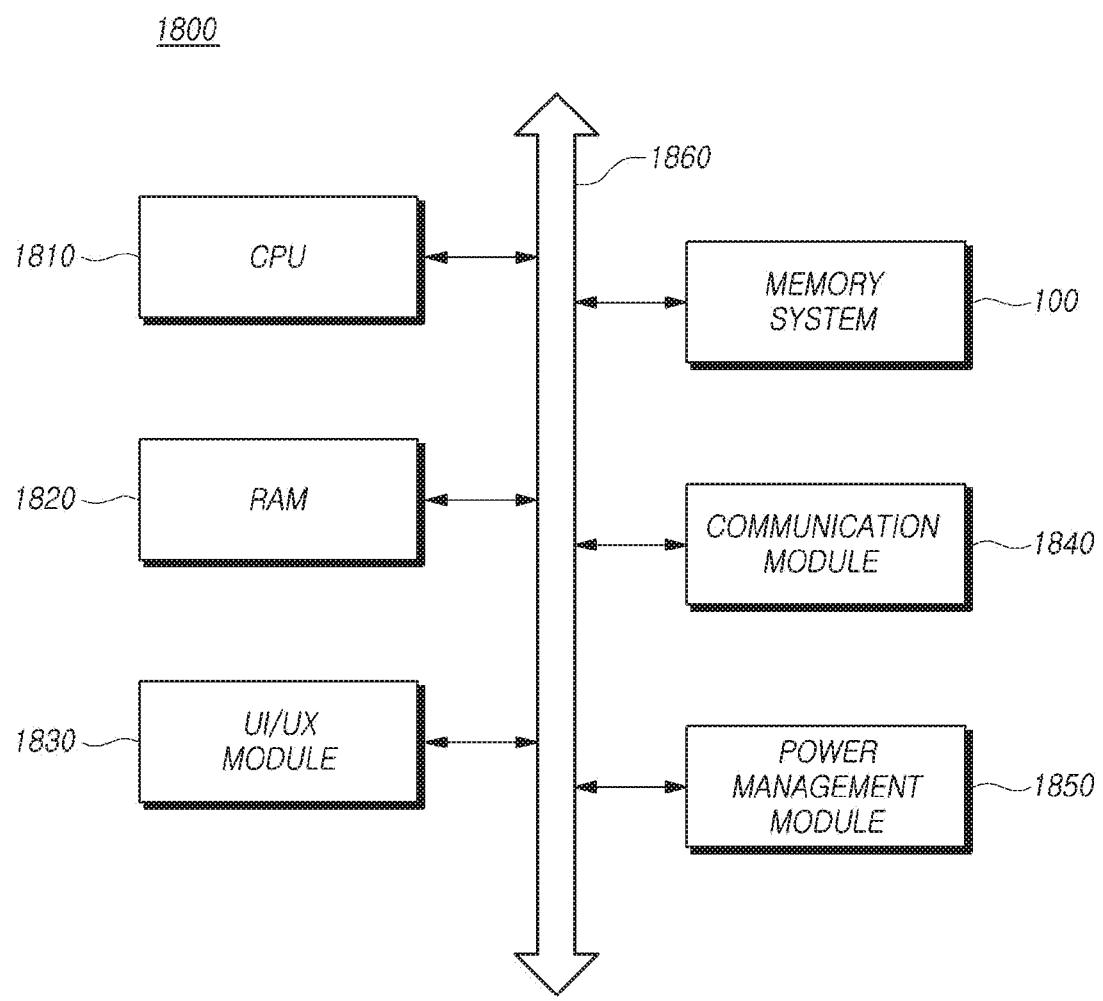
FIG. 18 is a block diagram schematically illustrating a computing system in accordance with an embodiment of the disclosure.

FIG. 18 is a block diagram schematically illustrating a computing system 1800 in accordance with an embodiment of the disclosure.

Referring to FIG. 18, the computing system 1800 may include a memory system 100, a central processing unit (CPU) 1810 for controlling general operations of the computing system 1800, a RAM 1820 for storing data and information related with the operations of the computing system 1800, a UI/UX (user interface/user experience) module 1830 for providing use environment to a user, a communication module 1840 for communicating with an external device in a wired and/or wireless manner and a power management module 1850 for managing power used by the computing system 1800. Components 100, 1810, 1820, 1830, 1840 and 1850 are electrically coupled to a system bus 1860.

The computing system 1800 may include a PC (personal computer), a mobile terminal such as a smartphone and a tablet or various electronic devices.

The computing system 1800 may further include a battery for supplying an operating voltage, and may further include an application chipset, a graphic-related module, a camera image processor (CIS), a DRAM and the like. As those skilled in the art will understand, the computing system 1800 may include other components not shown in FIG. 18.

The memory system 100 may include not only a device which stores data in a magnetic disk, such as a hard disk drive (HDD), but also a device which stores data in a nonvolatile memory, such as a solid state drive (SDD), a universal flash storage (UFS) device and an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized as any of various types of storage devices, and may be mounted in any of various electronic devices.

The memory system 100 may perform the supply of differentiated pass voltages and the control thereof described above.

As is apparent from the above description, according to embodiments of the disclosure, it is possible to provide the memory system 100, the memory controller 120 and the memory device 110 capable of preventing an operation error during a data-related operation of the memory device 110.

Also, according to embodiments of the disclosure, it is possible to provide the memory system 100, the memory controller 120 and the memory device 110 enabling a normal read operation even when a change occurs in threshold voltages of the memory cells MC in the memory device 110 and distributions thereof.

Further, according to embodiments of the disclosure, it is possible to provide the memory system 100, the memory controller 120 and the memory device 110 capable of differentially supplying the pass voltage Vpass in a read operation, depending on a state (a program state or an erase state) of the memory cells MC in the memory device 110.

Although various embodiments of the disclosure have been illustrated and described, those skilled in the art will appreciate in light of the present disclosure that various modifications, additions and substitutions are possible, without departing from the scope and spirit of the invention. Therefore, the disclosed embodiments should be considered in a descriptive sense only and not for limiting the technological scope. The present invention is not limited by the disclosed embodiments. Rather, the present invention encompasses all configurations and operations falling within the scope of the appended claims and their equivalents.

What is claimed is:

1. A memory system comprising:
   a memory device having a plurality of word lines and a plurality of bit lines disposed therein, and configured to apply, in a set operation, different pass voltages to at least one first word line and at least one second word line among the plurality of word lines excluding a selected target word line depending on whether each of a page corresponding to the at least one first word line and a page corresponding to the at least one second word line is a programmed page or an erased pages; and
   a memory controller configured to control an operation of the memory device
   wherein the at least one first word line corresponds to the programmed page which includes at least one programmed memory cell, and
   wherein the at least one second word line corresponds to the erased page which includes at least one erased memory cell.

2. The memory system according to claim 1, wherein the set operation is a read operation.

3. The memory system according to claim 1, wherein the memory device applies a first pass voltage to the at least one first word line, and applies a second pass voltage lower than the first pass voltage to the at least one second word line.

4. The memory system according to claim 3, wherein the second pass voltage is greater than or equal to a maximum threshold voltage of at least one memory cell corresponding to the at least one second word line and is lower than the first pass voltage.

5. The memory system according to claim 4, wherein the second pass voltage is variable when the maximum threshold voltage varies.

6. The memory system according to claim 1,
   wherein the memory controller transmits most recent program location information indicating a most recently programmed page before performing the set operation of the memory device or a most recently programmed word line corresponding to the most recently programmed page, to the memory device, and
   wherein the memory device applies the different pass voltages to the at least one first word line and the at least one second word line, based on the most recent program location information.

7. The memory system according to claim 6, wherein the memory controller transmits the most recent program location information to the memory device in each set operation of the memory device.

8. The memory system according to claim 6,
   wherein, when the most recent program location information is changed, the memory controller stores the changed most recent program location information, and
   wherein, in the set operation of the memory device, the memory controller omits transmission of the changed most recent program location information when there is a history that the changed most recent program location information has already been transmitted, and transmits the changed most recent program location information when there is no history that the changed most recent program location information has already been transmitted.

9. The memory system according to claim 1,
   wherein the memory controller transmits boundary erase location information indicating an erased page adjacent to a most recently programmed page before performing the set operation of the memory device or an erased word line corresponding to the adjacent erased page, to the memory device, and
   wherein the memory device applies the different pass voltages to the at least one first word line and the at least one second word line, based on the boundary erase location information.

10. A memory controller comprising:
    a memory interface configured to communicate with a memory device which has a plurality of word lines and a plurality of bit lines disposed therein; and
    a control circuit configured to control different pass voltages to be applied to at least one first word line and at least one second word line among the plurality of word lines excluding a selected target word line, in a set operation of the memory device, depending on whether each of a page corresponding to the at least one first word line and a page corresponding to the at least one second word line is a programmed page or an erased page,
    wherein the at least one first word line corresponds to the programmed page which includes at least one programmed memory cell, and
    wherein the at least one second word line corresponds to the erased page which includes at least one erased memory cell.

11. The memory controller according to claim 10, wherein the control circuit controls a first pass voltage to be applied to the at least one first word line, and controls a second pass voltage lower than the first pass voltage to be applied to the at least one second word line.

12. The memory controller according to claim 10,
    wherein the control circuit transmits pass voltage control information to the memory device through the memory interface, and
    wherein, depending on the pass voltage control information, the control circuit controls first pass voltage applied to the at least one first word line and second pass voltage applied to the at least one second word line, wherein second pass voltage is different from the first pass voltage.

13. The memory controller according to claim 12, wherein the pass voltage control information comprises most recent program location information indicating a most recently programmed page before performing the set operation of the memory device or a most recently programmed word line corresponding to the most recently programmed page.

14. The memory controller according to claim 12, wherein the pass voltage control information comprises boundary erase location information indicating an erased page adjacent to a most recently programmed page before performing the set operation of the memory device or an erased word line corresponding to the adjacent erased page.

15. A memory device comprising:
    a memory cell array having a plurality of word lines and a plurality of bit lines disposed therein; and
    a voltage output circuit configured to output different pass voltages to at least one first word line and at least one second word line among the plurality of word lines excluding a target word line for a set operation, depending on whether each of a page corresponding to the at least one first word line and a page corresponding to the at least one second word line stores data is a programmed page or an erased page, wherein the at least one first word line corresponds to the programmed page which includes at least one programmed memory cell, and wherein the at least one second word line corresponds to the erased page which includes at least one erased memory cell.

16. The memory device according to claim 15, wherein the voltage output circuit outputs a first pass voltage to the at least one first word line, and outputs a second pass voltage lower than the first pass voltage to the at least one second word line.

17. The memory device according to claim 15, further comprising:

control logic configured to receive pass voltage control information from a memory controller, wherein the voltage output circuit outputs a first pass voltage to the at least one first word line and outputs a second pass voltage different from the first pass voltage to the at least one second word line, depending on the pass voltage control information.

\* \* \* \* \*